United States Patent
Tsuchiya

(10) Patent No.: US 9,960,758 B2
(45) Date of Patent: May 1, 2018

(54) INTERPOLATION APPARATUS FOR ENCODER, CONTROLLING METHOD OF INTERPOLATION APPARATUS FOR ENCODER, NON-TRANSITORY STORAGE MEDIUM STORING CONTROLLING PROGRAM OF INTERPOLATION APPARATUS FOR ENCODER AND ENCODER

(71) Applicant: OLYMPUS CORPORATION, Tokyo (JP)

(72) Inventor: Hitoshi Tsuchiya, Hamura (JP)

(73) Assignee: OLYMPUS CORPORATION, Tokyo (JP)

( * ) Notice: Subject to any disclaimer, the term of this patent is extended or adjusted under 35 U.S.C. 154(b) by 272 days.

(21) Appl. No.: 14/813,760

(22) Filed: Jul. 30, 2015

(65) Prior Publication Data

US 2016/0036423 A1 Feb. 4, 2016

(30) Foreign Application Priority Data

Jul. 30, 2014 (JP) ................. 2014-155535

(51) Int. Cl.
*H03K 5/13* (2014.01)
*G01D 5/26* (2006.01)
*H03K 5/00* (2006.01)

(52) U.S. Cl.
CPC ..... *H03K 5/13* (2013.01); *H03K 2005/00052* (2013.01)

(58) Field of Classification Search
CPC ........... H03K 5/13; H03K 2005/00052; H03K 2005/00026; G01D 5/244; G01D 5/24409; G01D 5/24414; G01D 5/24419; G01D 5/347; G01D 5/34746; G01D 5/3473; G01D 5/34776; G01D 5/34784
See application file for complete search history.

(56) References Cited

U.S. PATENT DOCUMENTS

| 7,352,304 | B2 * | 4/2008 | Tsuchiya | H03M 1/207 324/207.12 |
|---|---|---|---|---|
| 9,127,967 | B2 * | 9/2015 | Nagura | G01D 5/34715 |
| 2016/0036423 | A1 * | 2/2016 | Tsuchiya | H03K 5/13 250/231.13 |

FOREIGN PATENT DOCUMENTS

| JP | H02-038814 A | 2/1990 |
|---|---|---|
| JP | H02-186221 A | 7/1990 |
| JP | 2007-178170 A | 7/2007 |

* cited by examiner

*Primary Examiner* — John Lee
(74) *Attorney, Agent, or Firm* — Scully, Scott, Murphy & Presser, P.C.

(57) ABSTRACT

An AD converter acquires first and second input values. A first multiplication unit multiplies a first tangent value, which is based on a first boundary angle based on a phase range of a reference value, by the reference value to calculate a first threshold value. A second multiplication unit multiplies a second tangent value, which is based on a second boundary angle based on the phase range, by the reference value to calculate a second threshold. A comparison unit determines whether the comparison value is within a particular phase range specified by the first and the second thresholds. The comparison unit determines magnitude of the comparison value when the comparison value is not within the particular phase range. A phase estimation unit updates the particular phase range to a phase range adjacent to a direction corresponding to the result of determination.

11 Claims, 19 Drawing Sheets

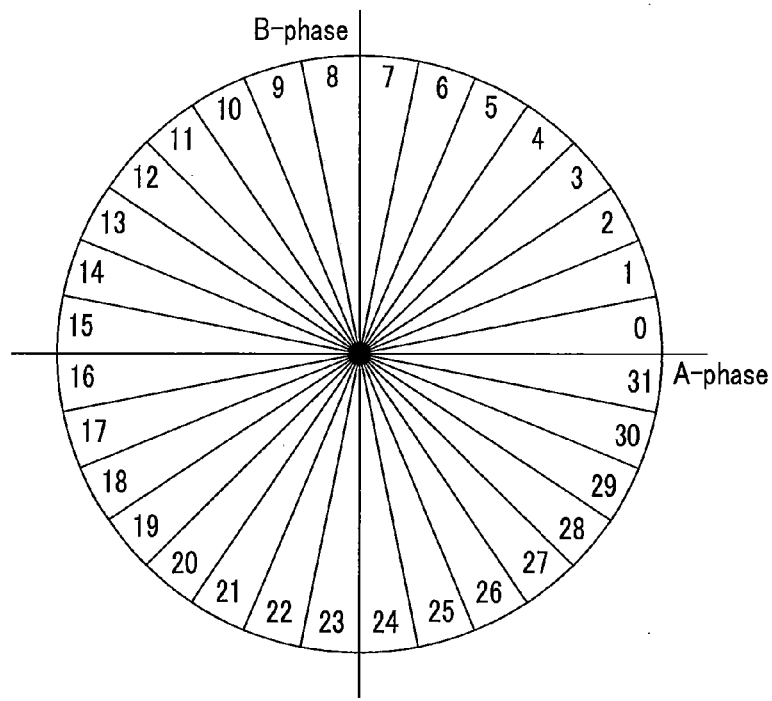
F I G. 2
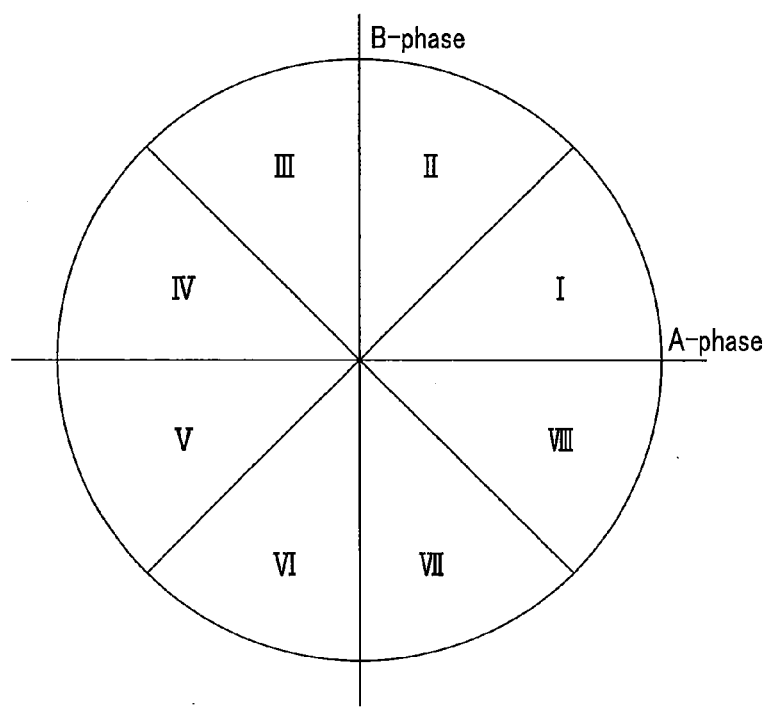
F I G. 3

| Region | A | B | Magnitude relation | Base | Opposite side |
|---|---|---|---|---|---|
| I | + | + | $|A| \geq |B|$ | A | B |
| II | + | + | $|A| < |B|$ | B | A |
| III | − | + | $|A| < |B|$ | B | A |
| IV | − | + | $|A| \geq |B|$ | A | B |
| V | − | − | $|A| \geq |B|$ | A | B |
| VI | − | − | $|A| < |B|$ | B | A |
| VII | + | − | $|A| < |B|$ | B | A |
| VIII | + | − | $|A| \geq |B|$ | A | B |
F I G. 4
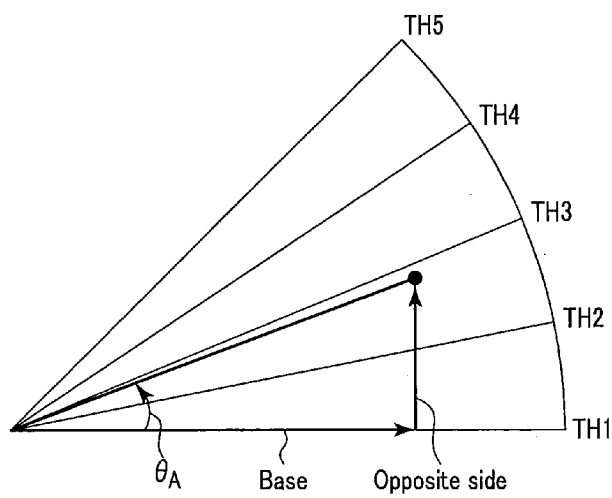
F I G. 5

| No | tan θ | tan θ (Decimal part 8bit) |
|---|---|---|
| TH1 | 0.00 | 0 |
| TH2 | 0.20 | 50 |
| TH3 | 0.41 | 106 |
| TH4 | 0.67 | 171 |
| TH5 | 1.00 | 256 |

| No | Phase | Region | Upper limit threshold | Lower limit threshold |
|---|---|---|---|---|
| 0 | $0 \leq \theta < 11.25°$ | I | TH2 | TH1 |
| 1 | $11.25 \leq \theta < 22.5°$ | I | TH3 | TH2 |
| 2 | $22.5 \leq \theta < 33.75°$ | I | TH4 | TH3 |
| 3 | $33.75 \leq \theta < 45°$ | I | TH5 | TH4 |
| 4 | $45 \leq \theta < 56.25°$ | II | TH5 | TH4 |
| 5 | $56.25 \leq \theta < 67.5°$ | II | TH4 | TH3 |
| 6 | $67.5 \leq \theta < 78.75°$ | II | TH3 | TH2 |
| 7 | $78.75 \leq \theta < 90°$ | II | TH2 | TH1 |
| 8 | $90 \leq \theta < 101.25°$ | III | −TH1 | −TH2 |
| 9 | $101.25 \leq \theta < 112.5°$ | III | −TH2 | −TH3 |
| 10 | $112.5 \leq \theta < 123.75°$ | III | −TH3 | −TH4 |
| 11 | $123.75 \leq \theta < 135°$ | III | −TH4 | −TH5 |
| 12 | $135 \leq \theta < 146.25°$ | IV | −TH5 | −TH4 |
| 13 | $146.25 \leq \theta < 157.5°$ | IV | −TH4 | −TH3 |
| 14 | $157.5 \leq \theta < 168.75°$ | IV | −TH3 | −TH2 |
| 15 | $168.75 \leq \theta < 180°$ | IV | −TH2 | −TH1 |
| 16 | $180 \leq \theta < 191.25°$ | V | TH1 | TH2 |
| 17 | $191.25 \leq \theta < 202.5°$ | V | TH2 | TH3 |
| 18 | $202.5 \leq \theta < 213.75°$ | V | TH3 | TH4 |
| 19 | $213.75 \leq \theta < 225°$ | V | TH4 | TH5 |
| 20 | $225 \leq \theta < 236.25°$ | VI | TH4 | TH5 |
| 21 | $236.25 \leq \theta < 247.5°$ | VI | TH3 | TH4 |
| 22 | $247.5 \leq \theta < 258.75°$ | VI | TH2 | TH3 |
| 23 | $258.75 \leq \theta < 270°$ | VI | TH1 | TH2 |
| 24 | $270 \leq \theta < 281.25°$ | VII | −TH2 | −TH1 |
| 25 | $281.25 \leq \theta < 292.5°$ | VII | −TH3 | −TH2 |
| 26 | $292.5 \leq \theta < 303.75°$ | VII | −TH4 | −TH3 |
| 27 | $303.75 \leq \theta < 315°$ | VII | −TH5 | −TH4 |
| 28 | $315 \leq \theta < 326.25°$ | VIII | −TH4 | −TH5 |
| 29 | $326.25 \leq \theta < 337.5°$ | VIII | −TH3 | −TH4 |
| 30 | $337.5 \leq \theta < 348.75°$ | VIII | −TH2 | −TH3 |
| 31 | $348.75 \leq \theta < 360°$ | VIII | −TH1 | −TH2 |

F I G. 8

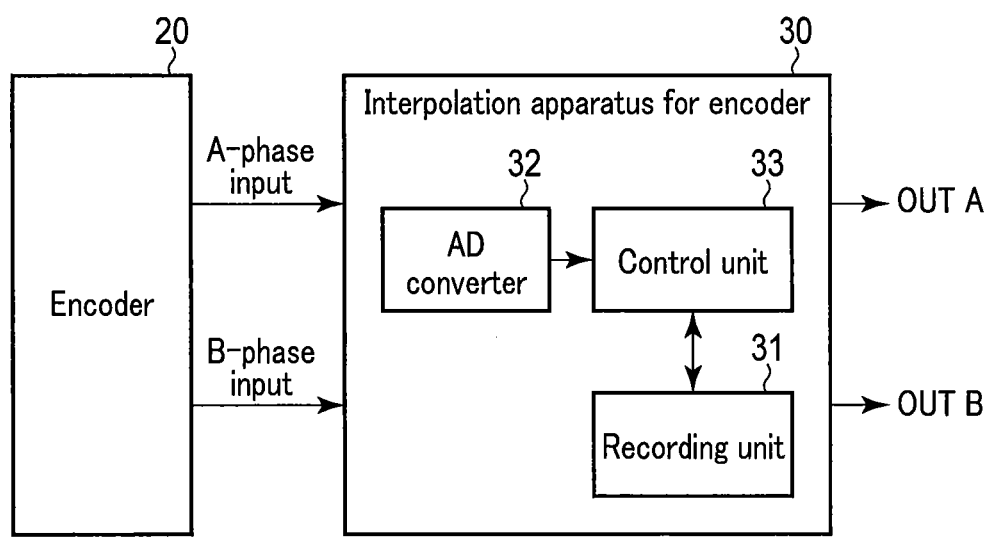
F I G. 14

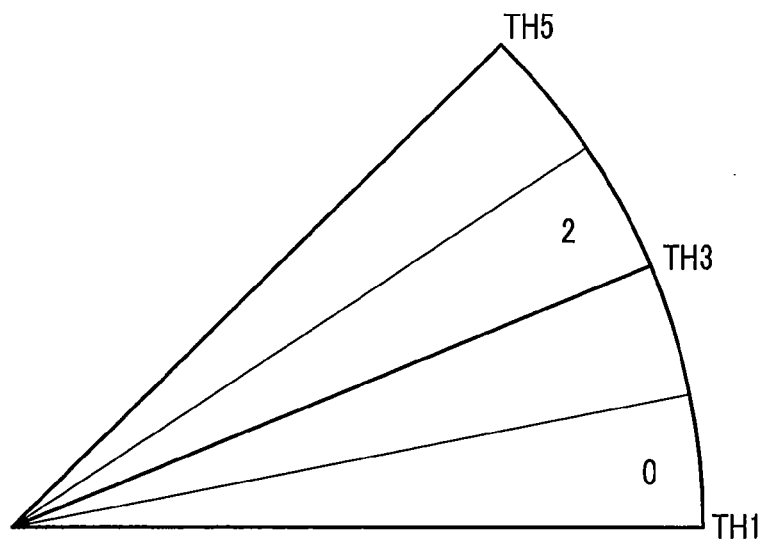
F I G. 16
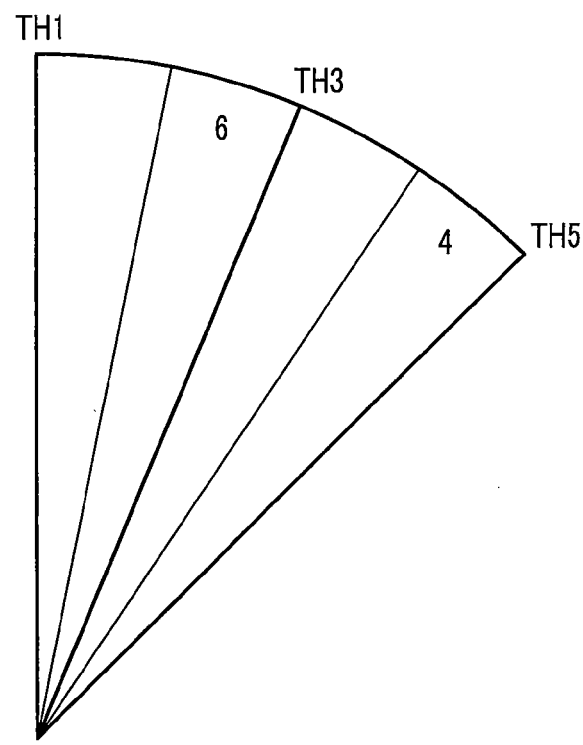
F I G. 17

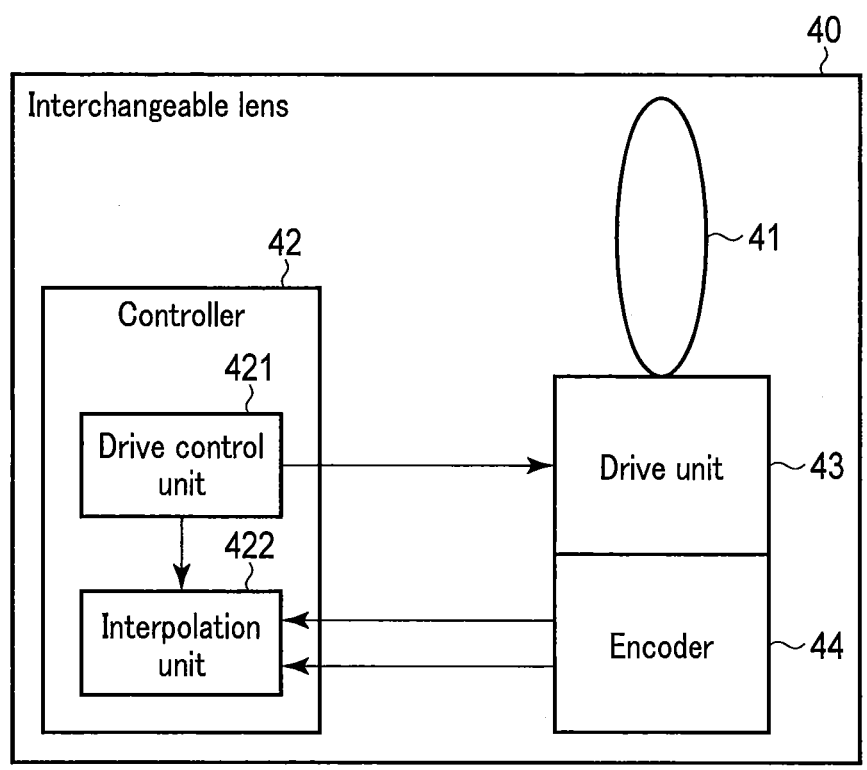
F I G. 19

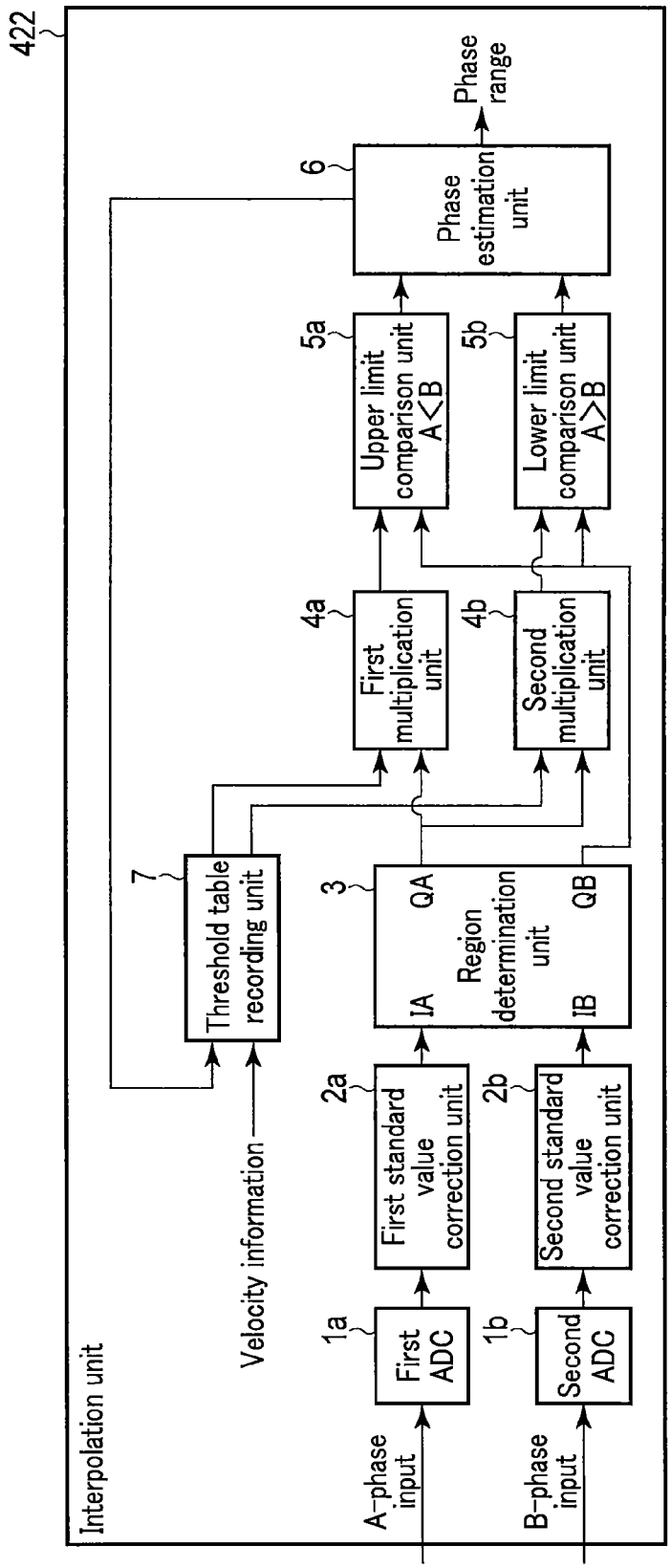
F I G. 20

INTERPOLATION APPARATUS FOR ENCODER, CONTROLLING METHOD OF INTERPOLATION APPARATUS FOR ENCODER, NON-TRANSITORY STORAGE MEDIUM STORING CONTROLLING PROGRAM OF INTERPOLATION APPARATUS FOR ENCODER AND ENCODER

CROSS-REFERENCE TO RELATED APPLICATIONS

This application is based upon and claims the benefit of priority from the prior Japanese Patent Application No. 2014-155535, filed Jul. 30, 2014, the entire contents of which are incorporated herein by reference.

BACKGROUND OF THE INVENTION

1. Field of the Invention

The present invention relates to an interpolation apparatus for an encoder, a controlling method of an interpolation apparatus for an encoder, and a non-transitory storage medium storing a controlling program of an interpolation apparatus for an encoder.

2. Description of the Related Art

There is known a device called an encoder which generates a sine wave signal and a cosine wave signal that are 90° different in phase from each other in accordance with the movement of a measurement object, digitizes each of the signals on the basis of a standard value, and counts the changes of each of the digitized signals to detect a movement amount.

Moreover, various interpolation methods have been suggested as methods of increasing the resolution of an encoder. For example, according to an interpolation method in Jpn. Pat. Appln. KOKAI Publication No. 2-186221, a sine component signal and a cosine component signal which are two signals are converted into polar coordinates, and angular information in the polar coordinates is used to conduct an interpolation that splits one sine-wave-shaped cycle by the following means: means for converting a sine component and a cosine component into digital quantities; means for calculating an angle and a radius of polar coordinates of a detection signal from the sine component and the cosine component that have been converted into digital quantities; and means for splitting and thus interpolating one cycle of the detection signal by using angular information in the polar coordinates.

An interpolation method in Jpn. Pat. Appln. KOKAI Publication No. 2-38814 previously calculates phase angle data corresponding to a sine component signal and a cosine component signal and then stores the phase angle data in a storage element, and uses the sine component signal and the cosine component signal as address signals to read the corresponding phase angle data from the storage element.

The method described above requires a solution to be found by complicated computations, and has various problems such as the decrease of response and the increase of cost which is caused by use of a separate storage element.

To solve the problems, an interpolation method in Jpn. Pat. Appln. KOKAI Publication No. 2007-178170 multiplies the amplitude amount of one of a sine wave signal and a cosine wave signal by an interpolation position parameter corresponding to a tangent value in each interpolation position in accordance with the number of interpolations of the phase angles of the sine wave signal and the cosine wave signal, compares the absolute value of this signal with the absolute value of the other signal for each interpolation position to see which is higher, and on the basis of the comparison result, estimates a region in which the phase angles of the sine wave signal and the cosine wave signal exist and which is separated by the interpolation positions. This suppresses the cost increase and enables higher response.

The interpolation method in Jpn. Pat. Appln. KOKAI Publication No. 2007-178170 has no particular problem when the number of splits to interpolate is small. However, when the number of calculations to multiply increases with the number of splits, the number of comparisons to compare the values to see which is higher also increases, so that the increase of the circuit scale is a practical problem. When the method described above is configured by software, the number of calculations also increases, so that the deterioration of response is a practical problem.

Furthermore, the use amount of a multiplying circuit and a comparator or the calculation amount in the case where the multiplying circuit and the comparator are configured by software is determined by the number of splits. Therefore, it is impossible to change a detection resolution in accordance with a detection target or the situation.

BRIEF SUMMARY OF THE INVENTION

An interpolation apparatus for an encoder, according to an aspect of the invention, comprises: an AD converter which converts a first sine wave signal generated in accordance with a change of the position of a measurement object into a digital signal to acquire a first input value, and converts a second sine wave signal which is generated in accordance with the change of the position of the measurement object and which is 90° different in phase from the first sine wave signal into a digital signal to acquire a second input value; a first multiplication unit which uses one of the first input value and the second input value as a reference value and uses the other as a comparison value to multiply a first tangent value by the reference value to calculate a first threshold, the first tangent value being based on a first boundary angle decided on the basis of the phase range of the reference value; a second multiplication unit which multiplies a second tangent value by the reference value to calculate a second threshold, the second tangent value being based on a second boundary angle decided on the basis of the phase range of the reference value; a comparison unit which determines whether the comparison value is within a particular phase range specified by the first threshold and the second threshold, the comparison unit determining that the comparison value is higher or lower than the first threshold and that the comparison value is higher or lower than the second threshold when the comparison unit determines that the comparison value is not within the particular phase range; and a phase estimation unit which updates the particular phase range to a phase range adjacent to a direction corresponding to the result of determination by the comparison unit as to whether the comparison value is higher or lower than the first threshold and the second threshold when the comparison unit determines that the comparison value is not within the particular phase range.

A controlling method of an interpolation apparatus for an encoder, according to an aspect of the invention, comprises: converting a first sine wave signal generated in accordance with the change of the position of a measurement object into a digital signal to acquire a first input value, and converting a second sine wave signal which is generated in accordance with the change of the position of the measurement object and which is 90° different in phase from the first sine wave signal into a digital signal to acquire a second input value; using one of the first input value and the second input value as a reference value and using the other as a comparison value to multiply a first tangent value by the reference value to calculate a first threshold, the first tangent value being based on a first boundary angle decided on the basis of the phase range of the reference value; multiplying a second tangent value by the reference value to calculate a second threshold, the second tangent value being based on a second boundary angle decided on the basis of the phase range of the reference value; determining whether the comparison value is within a particular phase range specified by the first threshold and the second threshold, and determining that the comparison value is higher or lower than the first threshold and that the comparison value is higher or lower than the second threshold when the comparison unit determines that the comparison value is not within the particular phase range; and updating the particular phase range to a phase range adjacent to a direction corresponding to the result of determination as to whether the comparison value is higher or lower than the first threshold and the second threshold when the comparison value is determined not to be within the particular phase range.

A non-transitory storage medium, according to an aspect of the invention, stores a controlling program of an interpolation apparatus for an encoder. The controlling program causes a computer to: convert a first sine wave signal generated in accordance with the change of the position of a measurement object into a digital signal to acquire a first input value, and convert a second sine wave signal which is generated in accordance with the change of the position of the measurement object and which is 90° different in phase from the first sine wave signal into a digital signal to acquire a second input value; use one of the first input value and the second input value as a reference value and use the other as a comparison value to multiply a first tangent value by the reference value to calculate a first threshold, the first tangent value being based on a first boundary angle decided on the basis of the phase range of the reference value; multiply a second tangent value by the reference value to calculate a second threshold, the second tangent value being based on a second boundary angle decided on the basis of the phase range of the reference value; determine whether the comparison value is within a particular phase range specified by the first threshold and the second threshold, and determine that the comparison value is higher or lower than the first threshold and that the comparison value is higher or lower than the second threshold when the comparison unit determines that the comparison value is not within the particular phase range; and update the particular phase range to a phase range adjacent to a direction corresponding to the result of a judgment as to whether the comparison value is higher or lower than the first threshold and the second threshold when the comparison value is determined not to be within the particular phase range.

Advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a graph showing the correspondence between the amplitude of the signals of two phases on two-dimensional coordinates in which the amplitude is on the horizontal axis and the vertical axis;

FIG. 3 is a graph showing one cycle of each of the signals of two phases split into 8 regions by 45°;

FIG. 4 is a table showing the relation between the signs of the signals of two phases and the magnitude relation of the respective absolute values;

FIG. 5 is a graph showing phase ranges in which an A-phase signal has a reference value and a B-phase signal has a comparison value among 32 split phase ranges;

FIG. 8 is a table showing 32 split phase ranges, 8 split regions, and the correspondence between an upper limit threshold and a lower limit threshold which are two thresholds to be boundaries of the respective phase ranges;

FIG. 14 is a diagram showing a configuration example of the interpolation apparatus for the encoder according to the second embodiment of the present invention;

FIG. 16 is a graph showing the relation between the low-resolution phase range and the thresholds in the case where the A-phase signal has the reference value;

FIG. 17 is a graph showing the relation between the phase range and the thresholds in the case where the B-phase signal has the reference value;

FIG. 19 is a diagram showing a configuration example of an interchangeable lens according to the fourth embodiment of the present invention;

FIG. 20 is a diagram showing a configuration example of an interpolation unit in the interchangeable lens;

DETAILED DESCRIPTION OF THE INVENTION

Figure 1:
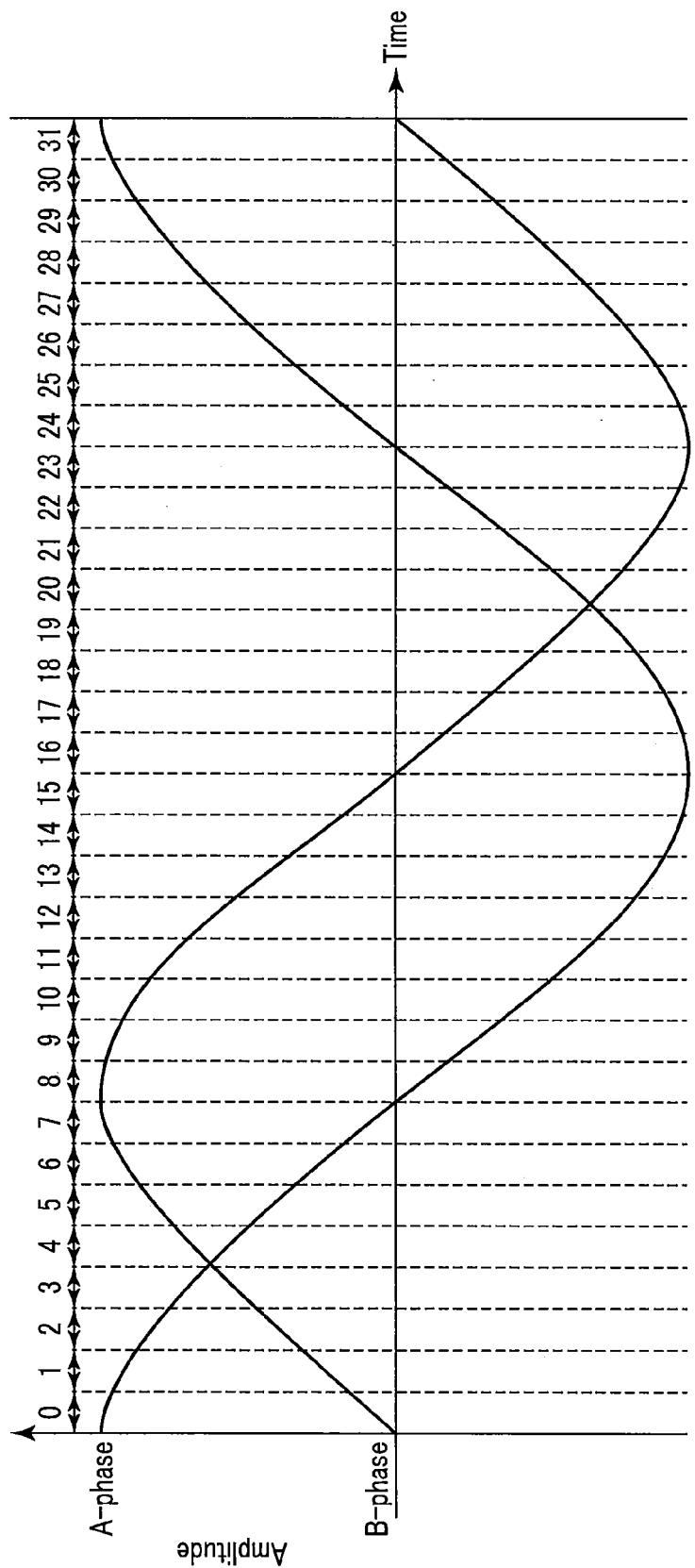
FIG. 1 is a graph showing, in 32 sections, one cycle of signals of two phases which are output from an encoder and which are 90° different in phase.

First, the basic concept of an interpolation apparatus for an encoder according to the present invention is described with reference to the drawings. FIG. 1 is a graph showing, in 32 sections, one cycle of an A-phase signal and a B-phase signal which are output from the encoder and which are sine wave signals (a sine wave signal and a cosine wave signal) that are 90° different in phase. In FIG. 1, the horizontal axis indicates time, and the vertical axis indicates amplitude. In FIG. 1, one cycle of the A-phase signal and the B-phase signal are split into 32 sections, that is, in FIG. 1, the A-phase signal and the B-phase signal are respectively separated into 0 to 31 phase ranges by 11.25°.

In the explanation of the basic concept, by way of example, which of the 32 split phase ranges the present phases of the A-phase signal and the B-phase signal are located in is estimated. The number of splits shown here can be changed. For example, the number of splits may be 200 or more.

FIG. 2 is a graph showing the relation between the amplitude of the A-phase signal and the amplitude of the B-phase signal shown in FIG. 1 on a two-dimensional coordinate system in which the amplitude of the A-phase signal is on the horizontal axis and the amplitude of the B-phase signal is on the vertical axis. A circular region shown in FIG. 2 is split into 32 phase ranges which are each indicated by 11.25° as in FIG. 1. A position on the two-dimensional coordinates decided by the amplitudes of the A-phase and the B-phase in a certain phase range in FIG. 1 is located in the corresponding phase range in FIG. 2.

As shown in FIG. 3, one cycle of each of the A-phase and the B-phase shown in FIG. 2 can be split into 8 regions by 45°. In the present embodiment, the 8 regions at 45° are further split by tangent values as will be described later so that the number of splits is increased to 32 as has been described above. The advantages of splitting one cycle into 8 regions at 45° are that the tangent values can be restricted to values 0 to 1, that a bit accuracy of decimal points can be restricted, and that deterioration of detection accuracy caused by the divergence of the tangent values can be prevented.

It is found in which of the 8 regions the present amplitudes of the A-phase signal and the B-phase signal are located, on the basis of the table shown in FIG. 4, that is, on the basis of the relation between the signs of the respective amplitudes of the A-phase signal and the B-phase signal and the magnitude relation of the absolute values of the respective amplitudes. It is also found in which of the A-phase and the B-phase the base and the opposite side for finding the later-described tangent values in each region correspond to, on the basis of the relation in FIG. 4. The signal to be the base has a reference value, and the signal to be the opposite side has a comparison value.

Figures 6, 7:
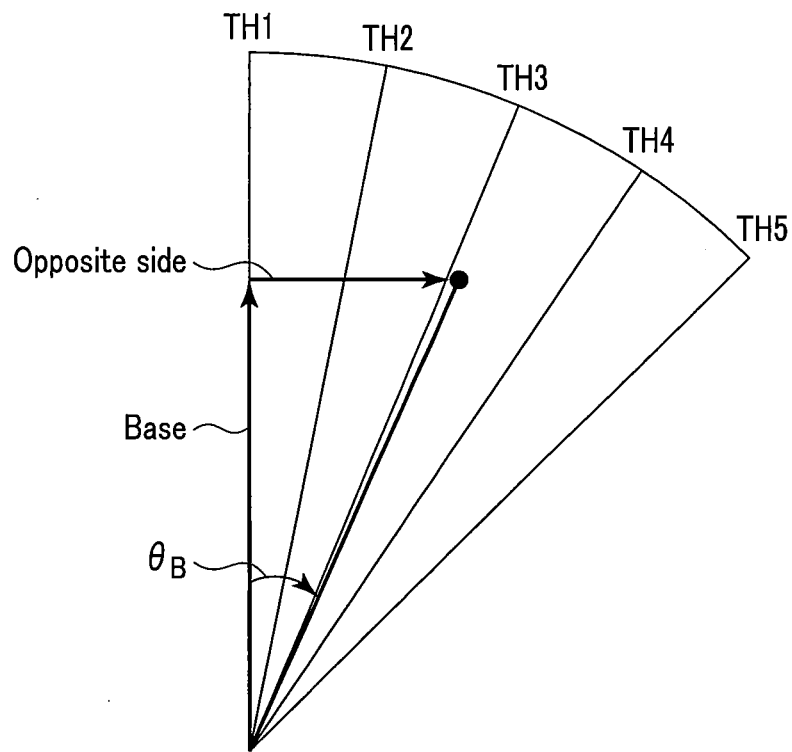
FIG. 6 is a graph showing phase ranges in which the B-phase signal has the reference value and the A-phase signal has the comparison value among the 32 split phase ranges.
FIG. 7 is a table showing the correspondence between the thresholds of the phase ranges and tangent values.

FIG. 5 and FIG. 6 show an example of further splitting the 8 split regions into 4 regions by 11.25°. These four regions are separated by thresholds TH1 to TH5 specified by 5 tangent values. FIG. 7 is a table of the tangent values respectively represented by TH1 to TH5. FIG. 5 shows an example of splitting by a tangent value tan θA in which the A-phase signal has the reference value, that is, splitting into regions I, IV, V, and VII. FIG. 6 shows an example of splitting by a tangent value tan θB in which the B-phase signal has the reference value, that is, splitting into regions II, III, VI, and VII.

FIG. 8 shows the correspondence between the 32 split phase ranges, the numbers of the 8 split regions, and an upper limit threshold and a lower limit threshold which are two thresholds to be boundaries of the 32 split phase ranges.

The overview of the operation of the interpolation apparatus for the encoder according to the present invention is described with reference to FIG. 9 and FIG. 10.

Figure 9:
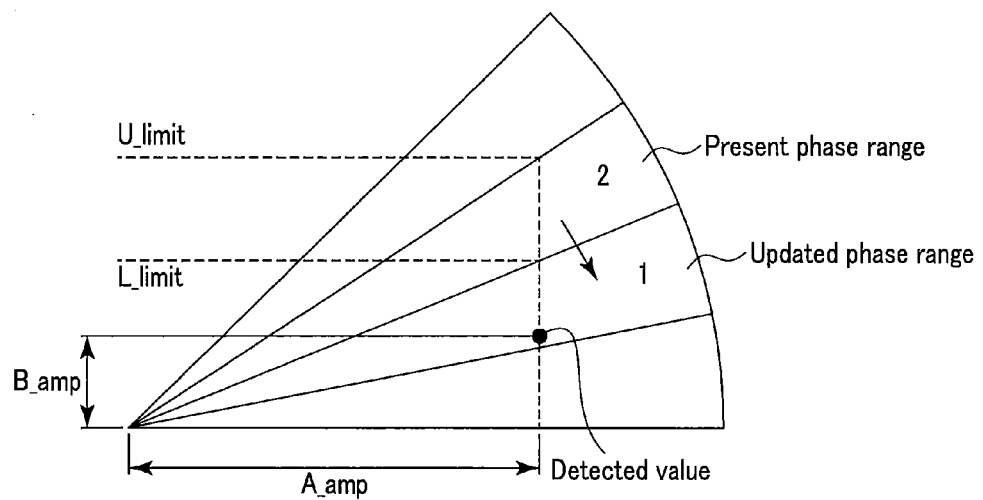
FIG. 9 is a graph showing the operation of changing the phase ranges in the case where the A-phase signal is used as a base to perform detection.

FIG. 9 shows the operation of the interpolation apparatus for the encoder according to the present invention in the case where the A-phase is used as the base, that is, the A-phase is used as the reference value to perform detection. The original phase range is, for example, "2". In this case, whether to change the phase range is determined from the relation with the amplitude of the B-phase as the comparison value by the detected amplitude of the A-phase and by each of the tangent values of the upper limit threshold TH3 and the lower limit threshold TH4 which are two thresholds to be the boundaries of the phase range "2".

First, the lower limit value (L_limit) of the amplitude of the B-phase in the phase range "2" is found by multiplying the amplitude A_amp of the A-phase by TH3.

$$L\_limit = A\_amp \times TH3 \quad \text{(Equation 1)}$$

The upper limit value (U_limit) of the amplitude of the B-phase in the phase range "2" is then found by multiplying the amplitude A_amp of the A-phase by TH4.

$$U\_limit = A\_amp \times TH4 \quad \text{(Equation 2)}$$

The calculated upper limit value and lower limit value are compared with the amplitude of the B-phase to see which is higher. The relation of the phase is determined from the comparison result.

$$B\_amp < U\_limit \quad \text{(Equation 3)}$$

$$B\_amp \geq L\_limit \quad \text{(Equation 4)}$$

When both the determination results in (Equation 3) and (Equation 4) are YES, this shows that no change has been made from the original phase range. In this case, the change of the phase range is unnecessary.

In the case of NO in (Equation 3) and YES in (Equation 4), the actual phase range is determined to be in a direction (the rightward direction in FIG. 1) which is ahead of the original phase range. In the case of YES in (Equation 3) and NO in (Equation 4), the actual phase range is determined to be in a direction (the leftward direction in FIG. 1) which is behind the original phase range. In accordance with the determination results, the phase range is changed by one phase range from the original phase range toward the direction in which the actual phase range is considered to be located.

In the example of FIG. 9, the original phase range is "2", but the phase is determined to be in direction which is behind the original phase range from the determination results. In this case, the phase range can track the change of the phase by changing the phase range to "1". If both (Equation 3) and (Equation 4) become YES in the next detection, the phase range can be estimated. If the current estimation of the phase range is performed, the present position of a measurement object can be estimated in accordance with the change amount between the previously estimated phase range and the currently estimated phase range.

Figure 10:
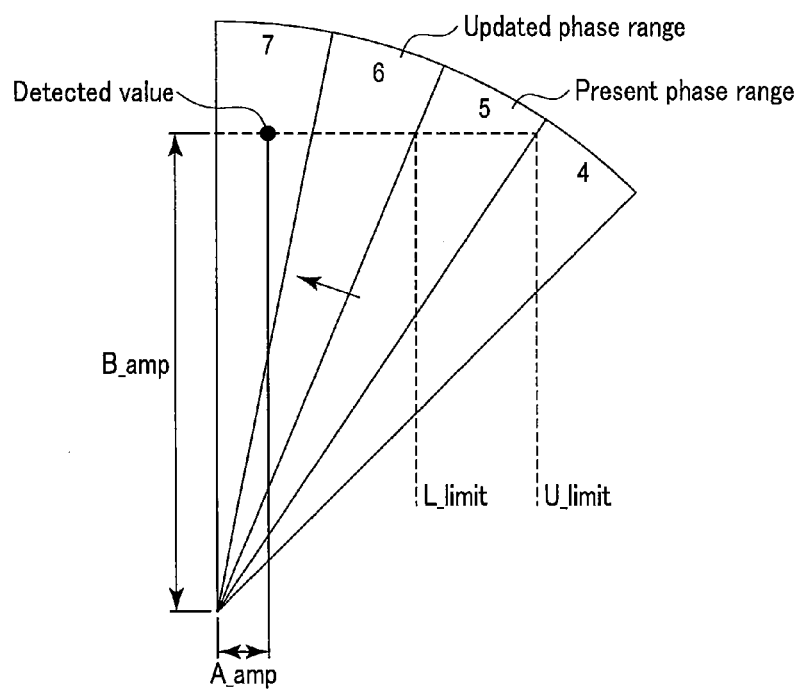
FIG. 10 is a graph showing the operation of changing the phase ranges in the case where the B-phase signal is used as a base to perform detection.

In the example of FIG. 10, the B-phase is used as a base to perform detection, and the original phase range is, for example, "5". In this case, whether to change the phase range is determined from the relation between the detected amplitude of the B-phase, the tangent values of TH3 and TH4 which are the boundaries of the phase range "5", and the amplitude of the B-phase to be calculated.

As in the case of FIG. 9, an upper limit value and a lower limit value are found by the following equations, and compared with the detection result of the A-phase.

$$L\_limit=B\_amp \times TH3 \qquad \text{(Equation 5)}$$

$$U\_limit=B\_amp \times TH4 \qquad \text{(Equation 6)}$$

$$A\_amp < U\_limit \qquad \text{(Equation 7)}$$

$$A\_amp \geq L\_limit \qquad \text{(Equation 8)}$$

(Equation 7) becomes YES and (Equation 8) becomes NO, and the phase range is therefore advanced by one so that the next detection phase range will be "6".

Although the phase range has not been estimated at this point, the detection phase range is changed to "7" by performing similar processing in the next cycle, and it is possible to track the change of the phase.

Even when the measurement object moves at the maximum velocity in normal use, it is possible to track the change of the phase with a delay of one cycle at maximum by setting the detection cycle of the phase so that a movement of one phase range or more may not be made. The cycle can be shortened to enhance tracking ability.

Figure 11:
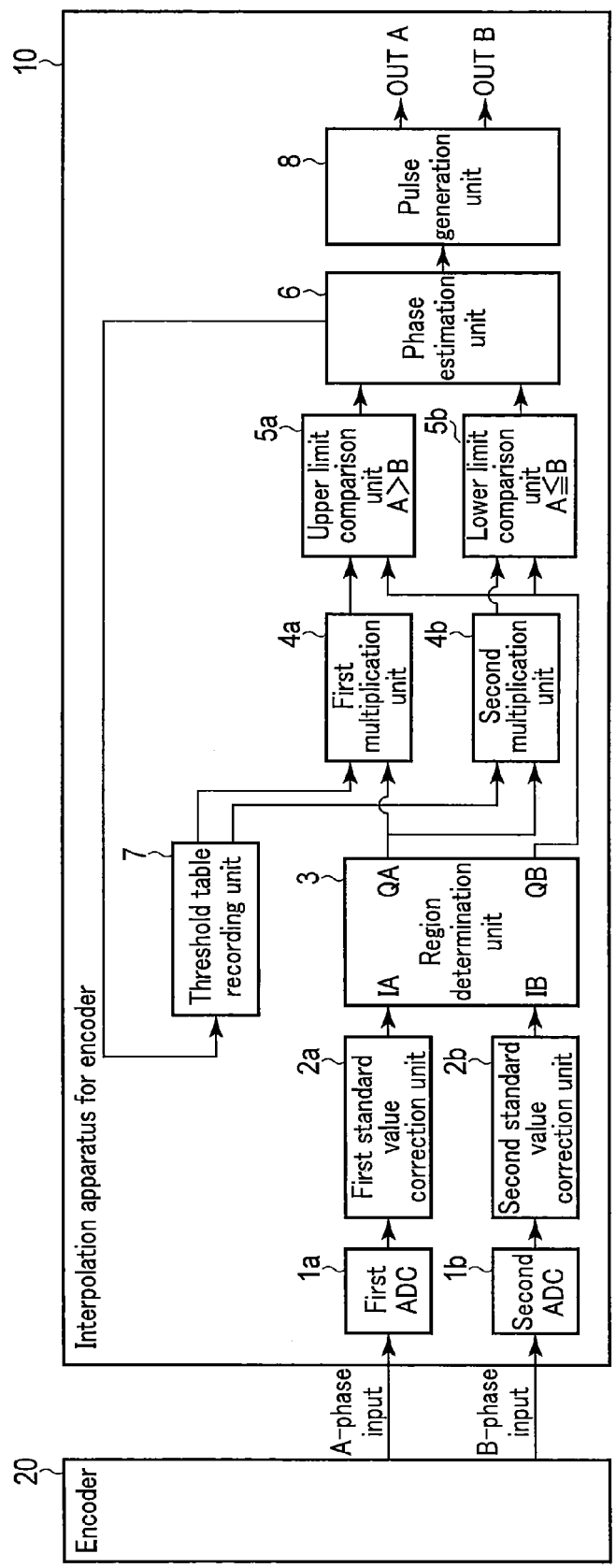
FIG. 11 is a diagram showing a configuration example of an interpolation apparatus for an encoder according to a first embodiment of the present invention.

Next, a first embodiment of the present invention is described with reference to FIG. 11. FIG. 11 is a block diagram of the interpolation apparatus for the encoder according to the present invention configured by hardware. An interpolation apparatus 10 for an encoder is electrically connected to an encoder 20.

The encoder 20 generates a sine wave signal (A-phase analog signal) and a cosine wave signal (B-phase analog signal) which are 90° different in phase in accordance with the movement of the measurement object, and outputs these signals of two phases to the interpolation apparatus 10 for the encoder.

The interpolation apparatus 10 for the encoder interpolates the signals received from the encoder 20. The interpolation apparatus 10 for the encoder includes a first AD converter (first ADC 1a), a second AD converter 1b (second ADC 1b), a first standard value correction unit 2a, a second standard value correction unit 2b, a region determination unit 3, a first multiplication unit 4a, a second multiplication unit 4b, an upper limit comparison unit 5a, a lower limit comparison unit 5b, a phase estimation unit 6, a threshold table recording unit 7, and a pulse generation unit 8.

The first ADC 1a converts an A-phase signal output from the encoder 20 into a digital signal. The second ADC 1b converts a B-phase signal output from the encoder 20 into a digital signal.

The first standard value correction unit 2a and the second standard value correction unit 2b subtract standard values from the A-phase and B-phase signals that have been converted into the digital signals, and thereby converts each of the signals into a digital signal having a value with a sign. Here, the standard value is a center value of the amplitude of each of the A-phase and B-phase signals. Further, the first standard value correction unit 2a and the second standard value correction unit 2b perform a gain adjustment to increase accuracy so that the amplitudes of the A-phase and the B-phase may be the same.

The region determination unit 3 determines from the relation described with reference to FIG. 4 which of the 8 regions of one cycle split by 45° the present phase exists, on the basis of the sign of the value of the amplitude of each of the A-phase and B-phase and the magnitude relation of the absolute values. The region determination unit 3 also determines which of the A-phase and the B-phase to allocate to the base and the opposite side in the later-described calculation to work out tangent values. The region determination unit 3 then respectively outputs a signal (reference value) allocated to the base from QA, and outputs a signal (comparison value) allocated to the opposite side from QB. For example, in the case of FIG. 9, the region determination unit 3 selects a region I, and then outputs an input value of the A-phase from QA and outputs an input value of the B-phase from QB.

The first multiplication unit 4a obtains an upper limit value of the amplitude by multiplying the value of QA output as the base by the upper limit threshold of the present region. The second multiplication unit 4b obtains a lower limit value of the amplitude by multiplying the value of QA output as the base by the lower limit threshold of the present region. The threshold multiplied here is a threshold output from the threshold table recording unit 7 on the basis of information regarding the phase range estimated by the phase estimation unit 6 at the subsequent stage.

The threshold table recording unit 7 records a threshold table to associate the upper limit value which is a first boundary angle, the lower limit value which is a second boundary angle, and tangent values. This threshold table has a configuration of, for example, a lookup table. On the basis of an input number of the phase range shown in FIG. 3, the threshold table recording unit 7 outputs the threshold corresponding to the number as shown in FIG. 8.

The upper limit comparison unit 5a and the lower limit comparison unit 5b compare the multiplication results obtained by the first multiplication unit 4a and the second multiplication unit 4b with the value of the opposite side. The upper limit comparison unit 5a determines whether the value of the opposite side is lower than the upper limit value, and outputs the determination result to the phase estimation unit 6. The lower limit comparison unit 5b determines whether the value of the opposite side is equal to or more than the lower limit value, and outputs the determination result to the phase estimation unit 6.

On the basis of the results of the magnitude determination output from the upper limit comparison unit 5a and the lower limit comparison unit 5b, the phase estimation unit 6 determines whether the present phase is within a particular phase range specified by the upper limit threshold and the lower limit threshold. When the present phase is within the particular phase range, that is, when the present phase is out of the particular phase range, the phase estimation unit 6 determines in which of the two phase ranges adjacent to the particular phase range the present phase exists, and the phase estimation unit 6 changes the phase range to the corresponding direction.

The phase estimation unit 6 cannot estimate which phase range the phase is located in an initial state immediately after the activation of the encoder 20. The phase range in the initial state is, for example, the phase range in the center of a region decided on the basis of a region determination result. Normally, there is a difference between the detected phase and the actual phase in the initial state. However, if the detected phase does not change, the phase estimation unit 6 can match the phase two cycles later at the latest.

The estimation method of the phase range in the initial state is not limited to the above method, and various methods are available. By way of example, when there is plenty of time from the activation to the operation, the phase estimation unit 6 may always determine the phase range in the initial state to be the particular position.

The pulse generation unit 8 outputs corresponding signal levels from OUTA and OUTB on the basis of the result of the phase range detected by the phase estimation unit 6. The correspondence between the phase range and the output level is the correspondence shown in FIG. 12.

Figure 12:
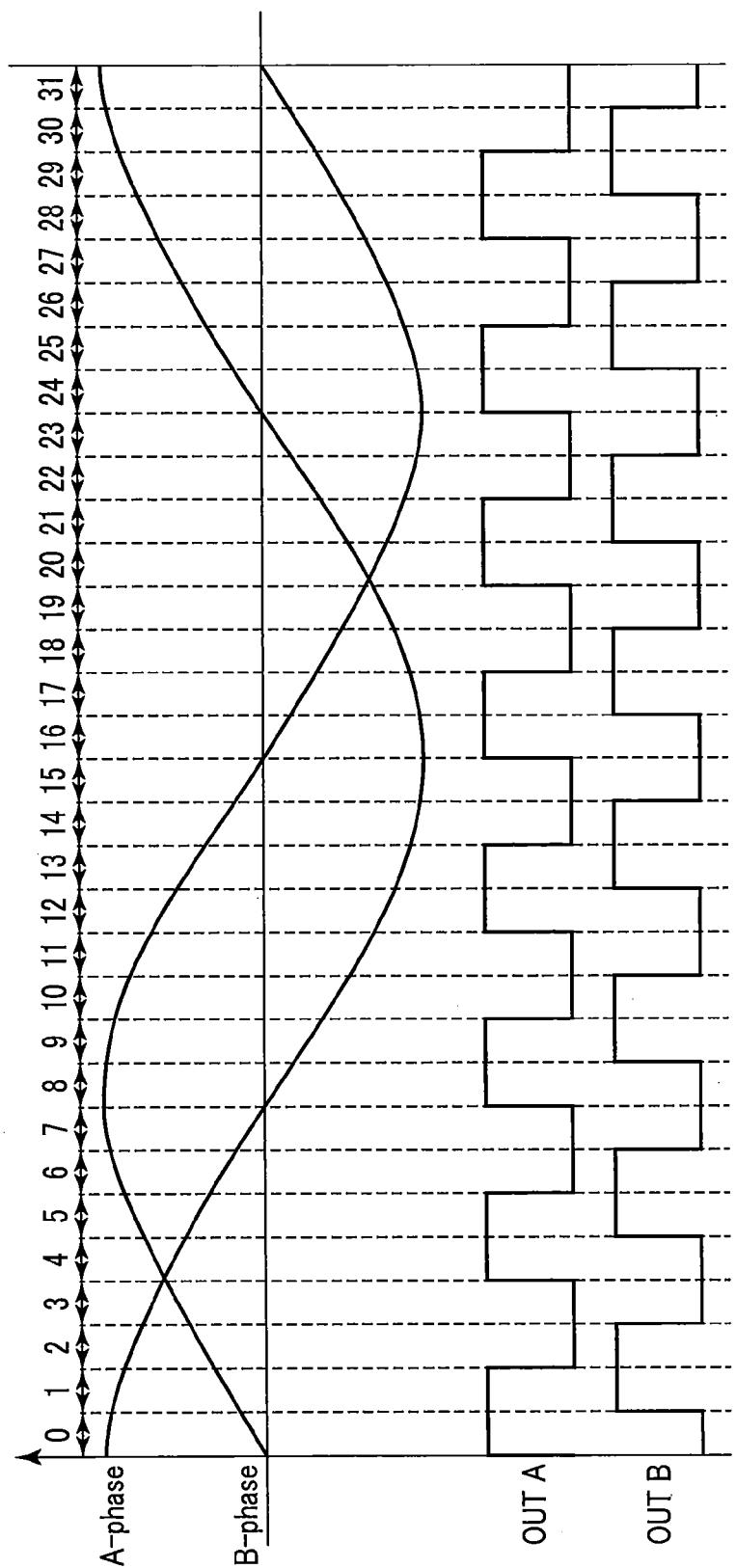
FIG. 12 is a graph showing the correspondence between signals of two phases input to the interpolation apparatus for the encoder according to the first embodiment of the present invention, and output signals.

An output similar to the output in FIG. 12 can also be obtained by a configuration which outputs a reversal value of the binary second lowest bit indicating the number which indicates a phase range from OUTA and outputs the exclusive OR of the first lowest bit and the second lowest bit of a binary number representation indicating the number which indicates a phase range from OUTB.

Pulse signals obtained by multiplying input signals by 32 are output from OUTA and OUTB by the configuration shown in FIG. 11.

As has been described above, according to the present embodiment, a high-resolution interpolation apparatus can be obtained by a small circuit including two multipliers and two comparison units.

The number of splits can be changed for any purpose by setting the phase range in the estimation unit and by varying the configuration of the threshold table. Since the present phase range is determined for only one split region, the calculation amount does not increase.

Figure 13:
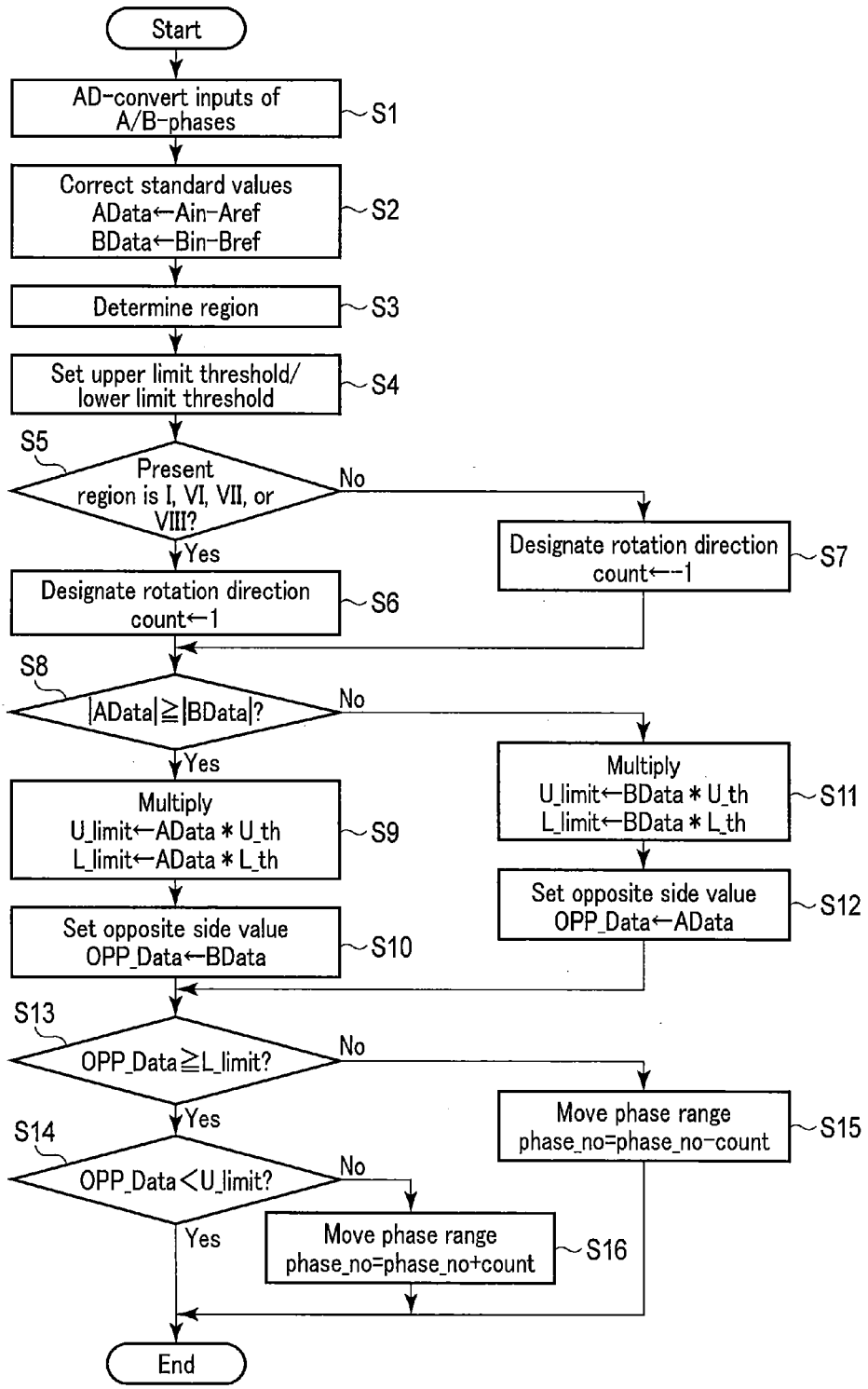
FIG. 13 is a flowchart showing an operation example of an interpolation apparatus for an encoder by software which enables an interpolation function according to a second embodiment of the present invention.

Next, a second embodiment of the present invention is described with reference to a flowchart in FIG. 13. In the present embodiment, software which enables the interpolation function of the encoder described in the first embodiment is described.

FIG. 14 shows the configuration of an interpolation apparatus for an encoder according to the present embodiment. As shown in FIG. 14, an interpolation apparatus 30 for an encoder includes a recording unit 31, an AD converter 32, and a control unit 33.

The recording unit 31 is, for example, a ROM which is a recording medium, and records, in such a manner that the control unit 33 can read, for example, a control program for the interpolation apparatus 30 for the encoder, tangent value information respectively represented by TH1 to TH5 shown in FIG. 7, information indicating the correspondence between the signs of the amplitude of the A-phase signal and the B-phase signal and the magnitude relation of the absolute values and the numbers of the regions shown in FIG. 4, the ranges of the 32 split phases shown in FIG. 8, the 8 split regions, and information indicating the correspondence between the upper limit threshold and the lower limit threshold which are two thresholds to be the boundaries of each split.

The AD converter 32 converts the A-phase signal and the B-phase signal input to the AD converter 32 into digital signals.

The control unit 33 is, for example, a CPU, and performs a calculation in accordance with the program read from the recording unit 31, and inputs and outputs signals on the basis of the calculation result.

First, the control unit 33 starts operation when the electric power of the interpolation apparatus 30 for the encoder is applied. The control unit 33 reads the control program for the interpolation apparatus for the encoder from the recording unit 31. The control unit 33 then acquires a digital A-phase signal Ain and a digital B-phase signal Bin which are AD conversion results of the A-phase signal and the B-phase signal by the AD converter 32 output from the encoder 20 (S1).

The control unit 33 subtracts a standard value Aref from the amplitudes of the input signals. That is, the control unit 33 subtracts the standard value Aref from the input digital A-phase signal Ain to calculate an A-phase signal AData, and subtracts a standard value Bref from the input digital B-phase signal Bin to calculate a B-phase signal BData (S2). As in the first embodiment, the standard value is a center value of the input of each of the A-phase and B-phase.

The control unit 33 then determines the region in which the present phase range is estimated to exist, from the A-phase amplitude and B-phase amplitude (S3). No phase range is determined immediately after activation. Thus, the control unit 33 estimates a corresponding region in 8-split one cycle from the signs and absolute values of the amplitude of the A-phase and B-phase input signals by which the standard values have been corrected, on the basis of the relation which has been read from the recording unit 31 and which has been described with reference to FIG. 4. After estimating a phase range, the control unit 33 uses the region in which the estimated phase range exists. In the estimation of the phase range, it can be determined that the phase range has been estimated when the conditions in Equation 3 and Equation 4 or in Equation 7 and Equation 8 are satisfied.

The control unit 33 then sets an upper limit threshold U_th and a lower limit threshold L_th on the basis of the present phase range (S4). When no phase range is estimated immediately after activation, any phase range has only to be selected in the estimated region. The threshold in each of the phase ranges is determined on the basis of the correspondence shown in FIG. 8.

The control unit 33 then decides a rotation direction to change the phase range on the basis of the estimated region. Thus, the control unit 33 determines which of the regions I, VI, VII, and VIII the estimated region is (S5). The rotation direction here is the change direction of the phase range in the case where the detected value of the phase has exceeded the upper limit. When the estimated region is one of I, VI, VII, and VIII, the control unit 33 sets, to 1, the value of a parameter count indicating the change amount and the change direction of the phase range in the case where the detected value of the phase has exceeded the upper limit (S6). In contrast, when the estimated region is not one of I, VI, VII, and VIII, that is, when the estimated region is one of II, III, IV, and V, the control unit 33 sets, to −1, the value of the parameter count indicating the change amount and the change direction of the phase range in the case where the detected value of the phase has exceeded the upper limit (S7). Here, the magnitude of the count indicates the change of the phase range, and the sign of the count indicates the change direction of the phase range. The positive direction of the change direction is a direction to advance the phase, and the negative direction is a direction to return the phase. For example, when the count is 1, the phase range is changed in a direction in which the number of the phase range increases one by one, that is, so that the phase range rotates counterclockwise whenever the detected value of the phase exceeds the upper limit. When the count is −1, the phase range is changed in a direction in which the number of the phase range decreases one by one, that is, so that the phase range rotates clockwise whenever the detected value of the phase exceeds the upper limit.

The control unit 33 determines whether the absolute value of the A-phase signal AData or the absolute value of the B-phase signal BData is higher, and thereby decides by reference to the relation in FIG. 4 whether to determine the AData or the BData as the base (reference value) in the tangent value that uses the A-phase signal and the B-phase signal (S8).

When having determined the A-phase signal as the base, the control unit 33 multiplies the A-phase signal AData by the upper limit threshold U_th and the lower limit threshold L_th, and generates the upper limit value U_limit and the lower limit value L_limit (S9). The control unit 33 then determines the B-phase signal BData which is the opposite side as OPP_Data (S10). When having determined the B-phase signal as the base, the control unit 33 multiplies the B-phase signal BData by the upper limit threshold U_th and the lower limit threshold, and calculates the upper limit value U_limit and the lower limit value L_limit (S11). The control unit 33 then determines the A-phase signal AData which is the opposite side as OPP_Data (S12).

The control unit 33 then estimates a phase range. To this end, the control unit 33 compares the lower limit value L_limit with the value of the opposite side to see which is higher (S13). When the value of the opposite side is higher than the lower limit value L_limit, the control unit 33 compares the upper limit value U_limit with the value of the opposite side to see which is higher (S14).

When the value of the opposite side is equal to or more than the lower limit value L_limit in S13, the control unit 33 changes the phase range (S15). The phase range is changed if the value of the count decided in S6 or S7 is added to or subtracted from a parameter phase_no indicating the number of the present phase range. The movement direction of the phase range is in a direction (negative direction) opposite to the rotation direction designated in S6 or S7. In this case, the value of the count is subtracted from the value of the phase_no.

When the value of the opposite side is higher than the upper limit value U_limit in S14, the control unit 33 changes the phase range (S16). The movement direction of the phase range in this case is the same direction (positive direction) as the rotation direction designated in S6 or S7. In this case, the value of the count is added to the value of the phase_no.

When the value of the opposite side is less than or equal to the upper limit value U_limit in S14, the control unit 33 determines that the detected phase exists in the present phase range. That is, the phase range is not changed in S14.

If the processing in the flowchart described above is periodically performed, for example, on a 100 μS cycle, it is possible to accurately track the change of the phase.

As described above, if the control unit 33 performs the control program which enables the function of the interpolation apparatus for the encoder according to the present embodiment, the control unit 33 can determine the present position of the phase input from the encoder 20 merely by two multiplications and two comparison calculations. Thus, the calculation load associated with this position determination is low. In this way, the technique according to the present invention is also enabled by software.

Next, a third embodiment of the present invention is described. An interpolation apparatus for an encoder according to the present embodiment further has a configuration for performing control to dynamically switch a resolution in addition to the configuration which has the same functions as the functions described above in the first embodiment or the second embodiment.

Figure 15:
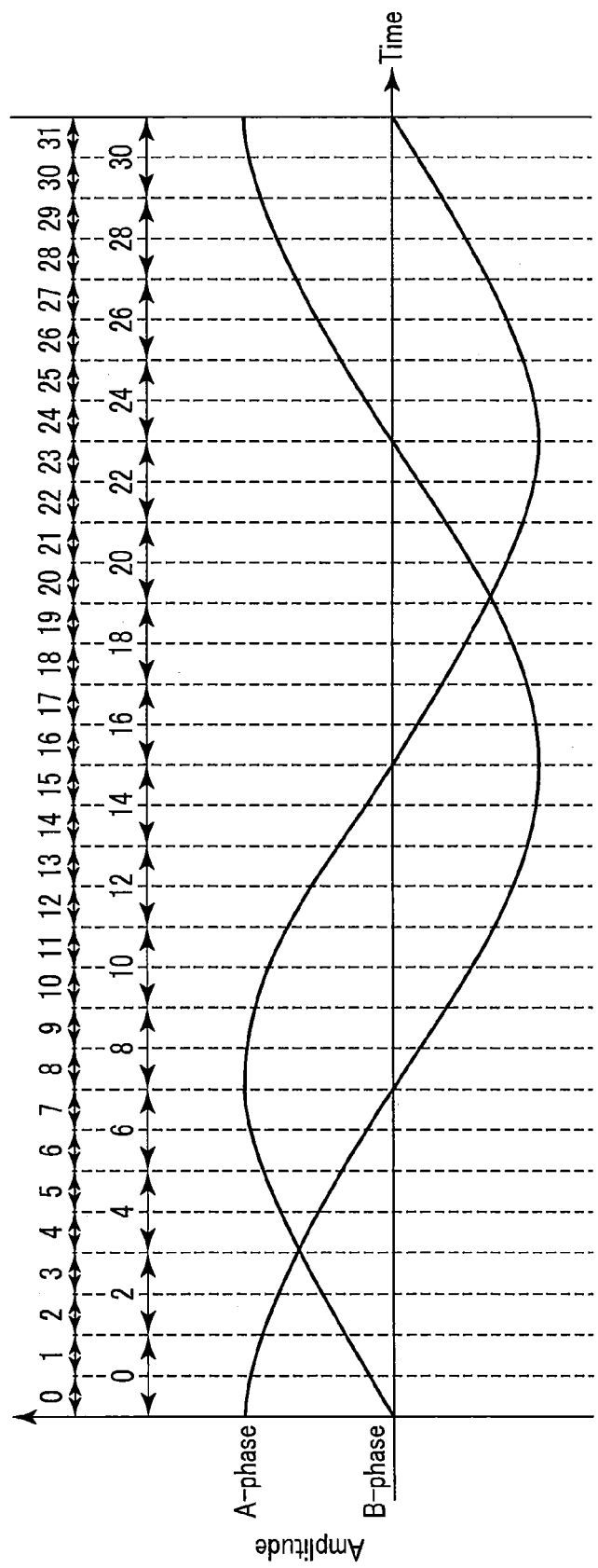
FIG. 15 is a graph showing how resolution is switched by switching the number of splits in one cycle.

FIG. 15 is a graph showing how the resolution is switched by switching the number of splits in one cycle. The interpolation apparatus for the encoder according to the present embodiment normally operates in 32 split phase ranges as in the first embodiment or the second embodiment, and operates in 16 split phase ranges as shown in FIG. 15 in some cases. Thus, the interpolation apparatus for the encoder according to the present embodiment operates with different resolutions.

When, for example, an unshown drive unit to which the encoder is attached is operating at high speed, that is, when the changes of the phases of the signals of two phases are great, the interpolation apparatus for the encoder according to the present embodiment switches the resolution to half, that is, from 32 splits to 16 splits. As a result, the detection tracking ability of the phase range is improved two-fold. Therefore, a high-speed operation is more easily tracked. The interpolation apparatus for the encoder according to the present embodiment uses every other threshold of the 32 splits as the threshold to switch the phase range to a lower resolution. In this way, the resolution of the phase range can be easily switched from 32 splits to 16 splits. There is almost no increase of resources due to the switch of the resolution.

FIG. 16 and FIG. 17 show the relation between the phase range and the thresholds. FIG. 16 shows an example of a phase range 1. When 16 split phase ranges are used, every other threshold of the 32 splits is used. Therefore, in the case of the phase range 1, TH1, TH3, and TH5 are used. In this case, as shown in FIG. 16, the phase range 1 is split by two phase ranges of the 32 splits, that is, by 22.5°. FIG. 17 shows an example of a phase range 2. In the case of the phase range 2 as well, TH1, TH3, and TH5 are used. In this case, as shown in FIG. 17, the phase range 2 is split by two phase ranges of the 32 splits, that is, by 22.5°.

Figure 18A:
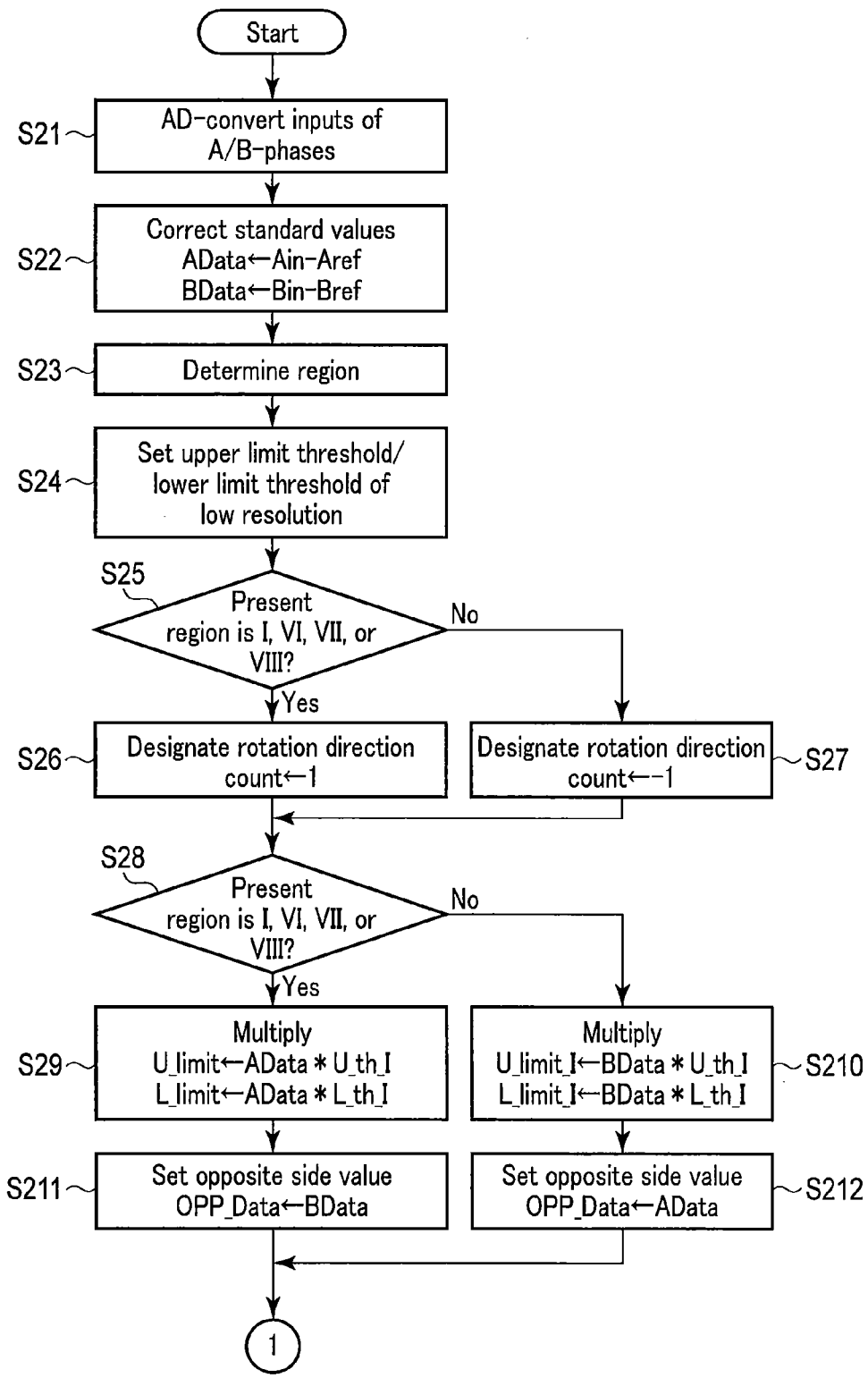
FIG. 18A is a flowchart showing an operation example of an interpolation apparatus for an encoder by software which enables an interpolation function according to a third embodiment of the present invention.
Figure 18B:
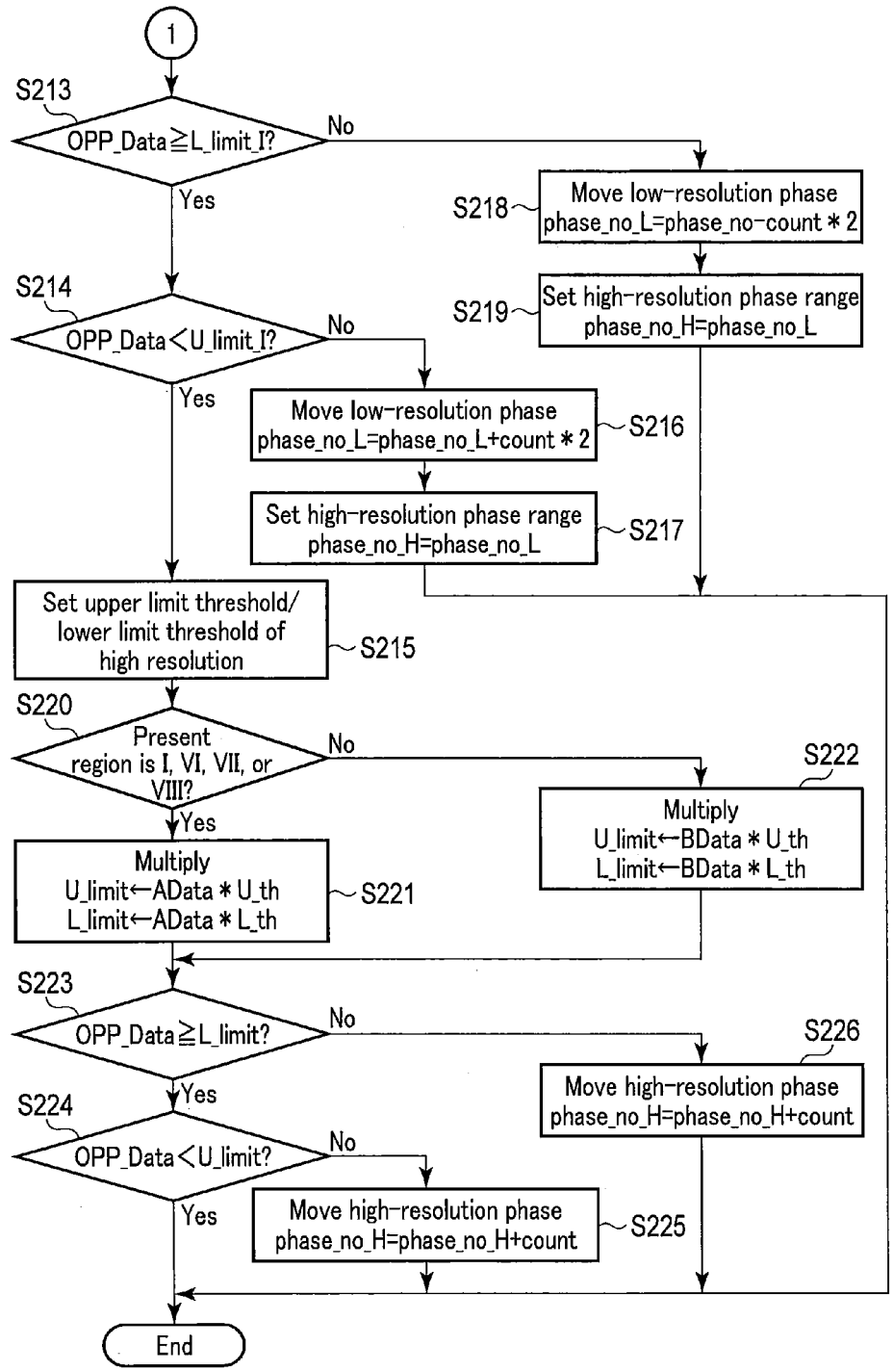
FIG. 18B is a flowchart showing the operation example of the interpolation apparatus for the encoder by software which enables the interpolation function according to the third embodiment of the present invention.

Details of the present embodiment are described below with reference to a flowchart in FIG. 18A and FIG. 18B. An example of software similar to that in the second embodiment is described below. However, the technique according to the present invention can also be obtained by hardware.

First, the control unit 33 starts operation when the electric power of the interpolation apparatus 30 for the encoder is applied. The control unit 33 reads the control program for the interpolation apparatus for the encoder from the recording unit 31. The AD converter 32 converts the A-phase analog signal input from the encoder 20 into a digital signal, and then acquires a digital A-phase signal Ain. The AD converter 32 also converts the B-phase analog signal input from the encoder 20 into a digital signal, and then acquires a digital B-phase signal Bin (S21). The control unit 33 then subtracts the standard value Aref and the standard value Bref from the digital A-phase signal Ain and the input digital B-phase signal Bin to convert the signals into digital signals having values with signs, thereby acquiring an A-phase signal AData and a B-phase signal BData (S22).

The control unit 33 then estimates a corresponding region in 8-split one cycle from the relation between the A-phase signal and the B-phase (S23). This region can be estimated from the relation in FIG. 4.

The control unit 33 then selects an upper limit threshold U_th_1 and a lower limit threshold L_th_1 of low resolution, that is, of each of 16 split regions of the A-phase and the B-phase on the basis of the present phase range (S24). That is, the control unit 33 selects two adjacent thresholds among the three thresholds TH1, TH3, and TH5. For example, if the present phase range is the phase range 2, the control unit 33 selects TH5 as the upper limit threshold U_th_1, and selects TH3 as the lower limit threshold L_th_1.

The control unit 33 then decides a rotation direction to change the phase range on the basis of the estimated region. To this end, the control unit 33 determines whether the estimated region is I, VI, VII, or VIII (S25). When the estimated region is one of I, VI, VII, or VIII, the control unit 33 sets the value of the count to 1 (S26). In contrast, when the estimated region is not one of I, VI, VII, and VIII, that is, when the estimated region is one of II, III, IV, and V, the control unit 33 sets the value of the count to −1 (S27).

The control unit 33 then determines whether the absolute value of the A-phase signal AData or the absolute value of the B-phase signal BData is higher, and thereby decides by reference to the relation in FIG. 4 whether to determine the AData or the BData as the base in the tangent value that uses the A-phase and the B-phase (S28).

When the present phase range is determined to be one of the regions I, IV, V, and VIII, the control unit 33 sets so that the A-phase will be the base and the B-phase will be the opposite side. The control unit 33 then respectively multiplies the A-phase signal AData by the upper limit threshold and the lower limit threshold to calculate a low-resolution upper limit value U_limit_1 and a low-resolution lower limit value L_limit_1 (S29). The control unit 33 then selects the B-phase signal BData as OPP_Data (S211).

When the present phase range is determined not to be one of the regions I, IV, V, and VIII, that is, when the present phase region is one of II, III, VI, and VII, the control unit 33 sets so that the B-phase will be the base and the A-phase will be the opposite side. The control unit 33 then multiplies the B-phase AD value by the upper limit threshold and the lower limit threshold to calculate a low-resolution upper limit value U_limit_1 and a low-resolution lower limit value L_limit_1 (S210). The control unit 33 then selects the A-phase signal AData as OPP_Data (S212).

The control unit 33 determines whether the value of the opposite side is equal to or more than the low-resolution lower limit value L_limit_1 (S213). In the case of YES, the control unit 33 determines whether the value of the opposite side is lower than the low-resolution upper limit value U_limit_1 (S214).

In the case of NO in the determination in S214, the control unit 33 changes the phase range because the detected phase does not exist in the present low-resolution phase range (S216). Because of the low resolution, the change amount of the phase range is double the value of the change amount in the case of high resolution. The control unit 33 then sets an initial position of the high-resolution phase range based on the low-resolution phase range (S217). Various ways of deciding the initial position here are possible. For example, the high-resolution phase range which is the center of the low-resolution phase range may be the initial position, or the high-resolution phase range closest to the previous phase range in the low-resolution phase range may be the initial position. In the case of NO in S213, the control unit 33 changes the phase range because the detected phase does not exist in the present low-resolution phase range (S218). In this case as well, because of the low resolution, the change amount of the phase range is double the value of the change amount in the case of high resolution. The control unit 33 then sets an initial position of the high-resolution phase range based on the low-resolution phase range (S219). How to decide the initial position is similar to that in S217.

As described above, the currently detected phase does not exist in the previously detected low-resolution phase range in the case of NO in the determination in S213 or S214, so that the phase range is changed to the corresponding direction to finish one cycle.

In the case of YES in the determination in S213 and S214, it is possible to consider that the detected phase exists in the present low-resolution phase range. In this case, the control unit 33 sets the upper limit threshold and the lower limit threshold of the present high-resolution phase range as the upper limit threshold U_th and the lower limit threshold L_th (S215). Because of the high resolution, adjacent two thresholds are selected among TH1 to TH5.

After setting the threshold in S215, the control unit 33 determines the region in which the present phase range exists (S220). When the present region is determined to be one of the regions I, IV, V, and VIII, the control unit 33 calculates the upper limit value U_limit and the lower limit value L_limit from the A-phase signal AData corresponding to the base and the threshold (S221). In contrast, when the present region is determined not to be one of the regions I, IV, V, and VIII, that is, when the present region is judged to be one of II, III, VI, and VII, the control unit 33 calculates the upper limit value U_limit and the lower limit value L_limit from the A-phase signal AData corresponding to the base and the threshold (S222).

The control unit 33 determines whether the value OPP_Data corresponding to the opposite side is equal to or more than the lower limit value L_limit (S223), and further determines whether the OPP_Data is lower than the upper limit value U_limit (S224).

When both the determination results in S223 and S224 are YES, it can be estimated that the currently detected phase exists in the previously detected high-resolution phase range.

In the case of NO in the determination in S223, the control unit 33 changes the phase range because the currently detected phase does not exist in the previously detected phase range (S226). In the case of NO in S224 as well, the control unit 33 changes the phase range (S225). The change of the high-resolution phase range is similar to that described in the second embodiment.

As described above, a phase range is first estimated in low resolution, and when the phase range is estimated, a phase range is further estimated in high resolution. Therefore, the movement velocity of the drive unit is higher, and the tracking of the position detection can be continued in low resolution even when the position detection in high resolution cannot be tracked.

Next, a fourth embodiment is described. FIG. 19 is a functional block diagram of an example of how the interpolation apparatus for the encoder according to each of the embodiments described above is applied to a camera interchangeable lens. An interchangeable lens 40 includes an optical system 41, a controller 42, a drive unit 43, and an encoder 44. The controller 42 includes a drive control unit 421 and an interpolation unit 422. The encoder 44 corresponds to the encoder 20 described in each of the previous embodiments. The interpolation unit 422 corresponds to the interpolation apparatus 10 or 30 for the encoder described in each of the previous embodiments.

The optical system 41 images a subject figure on an imaging surface of an unshown camera body connected to the interchangeable lens 40.

The drive unit 43 moves part of the optical system 41, for example, to perform focus control for changing a focus position. The movement of the drive unit 43 is detected by the encoder 44 as sine wave signals of two phases which are 90° different in phase.

The sine wave signals output from the encoder 44 are subjected to the above-mentioned interpolation processing in the interpolation unit 422 in the controller 42. Thus, a higher-resolution estimation result of the phase range can be obtained. The controller 42 also detects the present position of the measurement object from the estimation result of the phase range.

The drive control unit 421 outputs a drive pulse to the drive unit 43 so that the drive unit 43 drives the optical system 41. Here, the drive control unit 421 performs a high-velocity drive for driving the drive unit 43 at high velocity or a low-velocity drive for driving the drive unit 43 at low velocity depending on the drive pulse.

FIG. 20 is a detailed block diagram of the interpolation unit 422. In FIG. 20, the differences between this configuration and the configuration of the interpolation apparatus for the encoder according to the first embodiment are only described.

Information indicating the control state of the drive unit 43 by the drive control unit 421 is input to the threshold table recording unit 7. The information indicating the control state is information that indicates whether the control state of the drive unit 43 is the high-velocity drive or the low-velocity drive.

A threshold table of tangent values for low resolution and a threshold table of tangent values for high resolution are stored in the threshold table recording unit 7. The threshold table recording unit 7 outputs a threshold in accordance with the low-resolution table when the information indicating the high-velocity drive is input thereto. The threshold table recording unit 7 outputs a threshold in accordance with the high-resolution table when the information indicating the low-velocity drive is input thereto.

Figure 21:
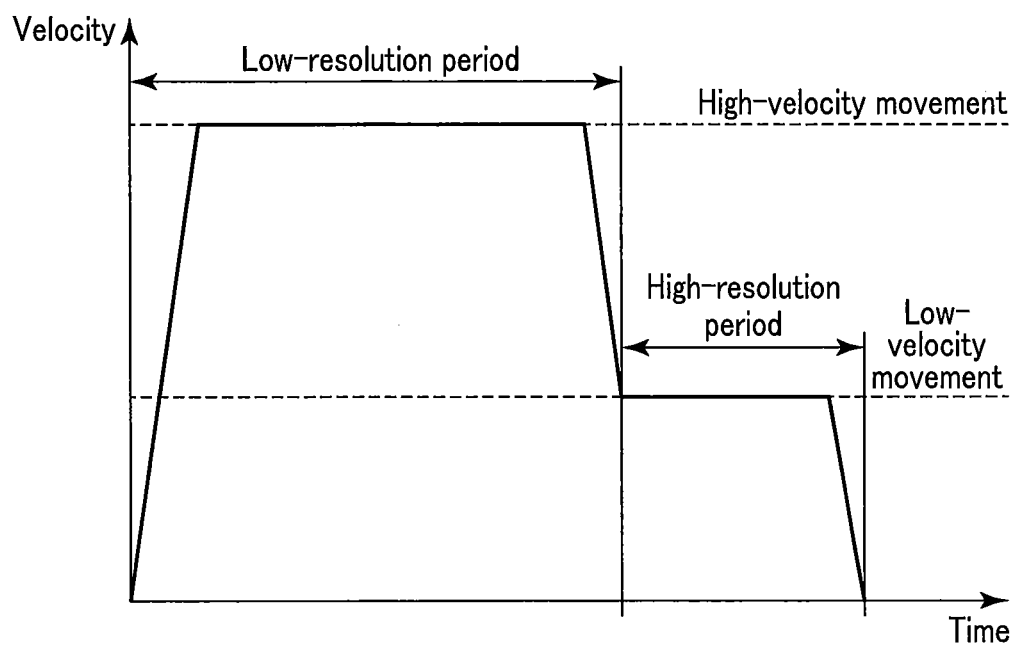
FIG. 21 is a time chart showing an example of drive control of a drive unit by a drive control unit.

FIG. 21 is a time chart showing an example of drive control of the drive unit 43 during the focus control, and shows the temporal change of the drive velocity of the drive unit 43.

In the focus control, a drive target position of the drive unit 43 is first reported to the drive control unit 421 of the controller 42. As a result, the drive control unit 421 inputs a drive pulse to the drive unit 43. In response to the input of the drive pulse, the drive unit 43 drives the optical system 41 to the drive target position. In such focus control, it is necessary to rapidly and correctly move the optical system 41 to the drive target position.

Thus, the drive control unit 421 controls to rapidly drive the drive unit 43 at the beginning of driving with reference to the position detection result to quickly bring the drive unit 43 closer to the drive target position. If the drive unit 43 comes closer to the drive target position, the drive control unit 421 controls to slowly drive the drive unit 43 so that the drive unit 43 can be correctly stopped.

In the example of FIG. 21, the interpolation unit 422 of the controller 42 estimates a phase range with low resolution to attach importance to the tracking ability when the drive unit 43 is driving at high velocity. After the drive unit 43 has shifted to the low-velocity drive, the interpolation unit 422 of the controller 42 estimates a phase range with high resolution to perform accurate position detection.

Figure 22A:
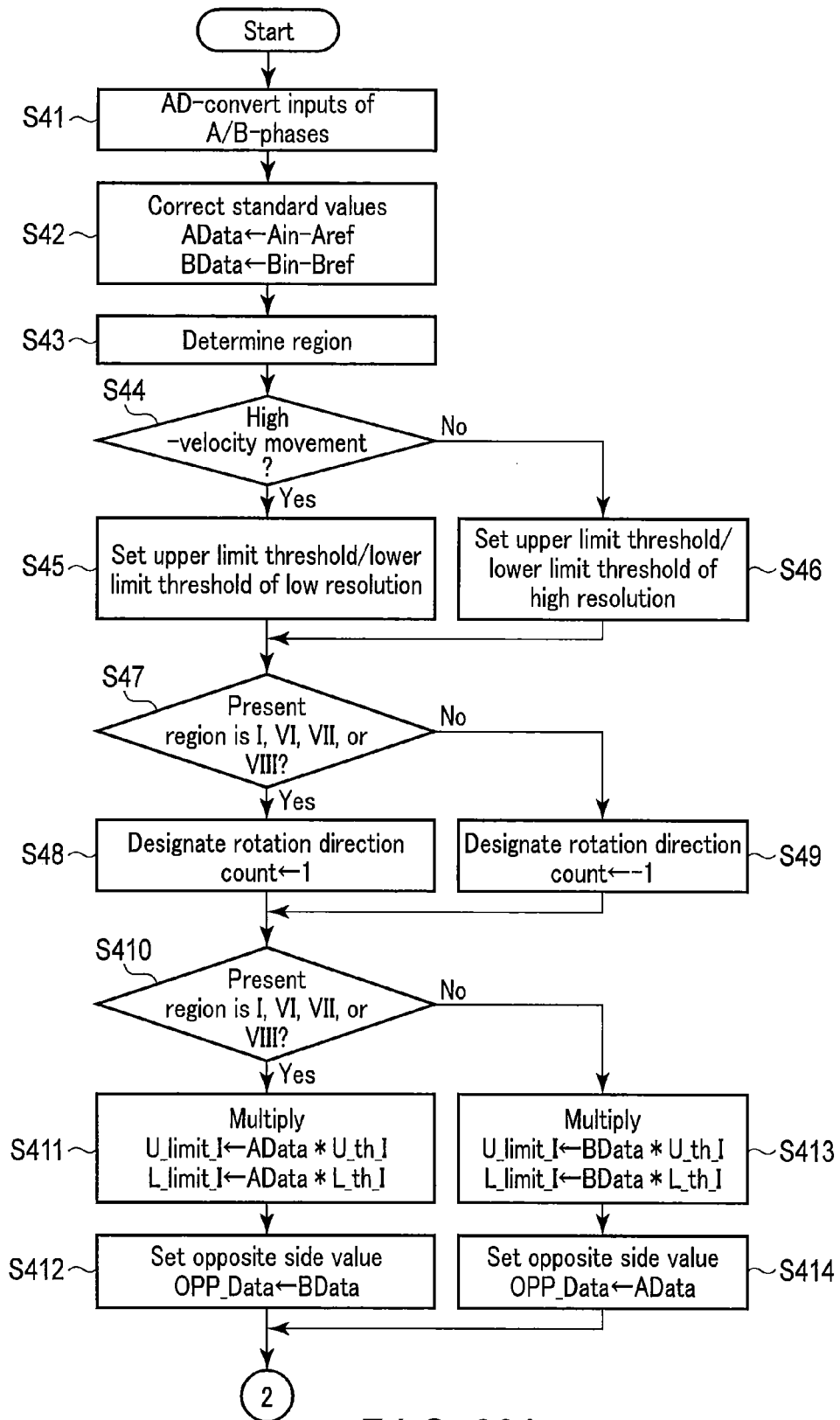
FIG. 22A is a flowchart illustrating the control of the interpolation unit in the interchangeable lens according to the fourth embodiment.
Figure 22B:
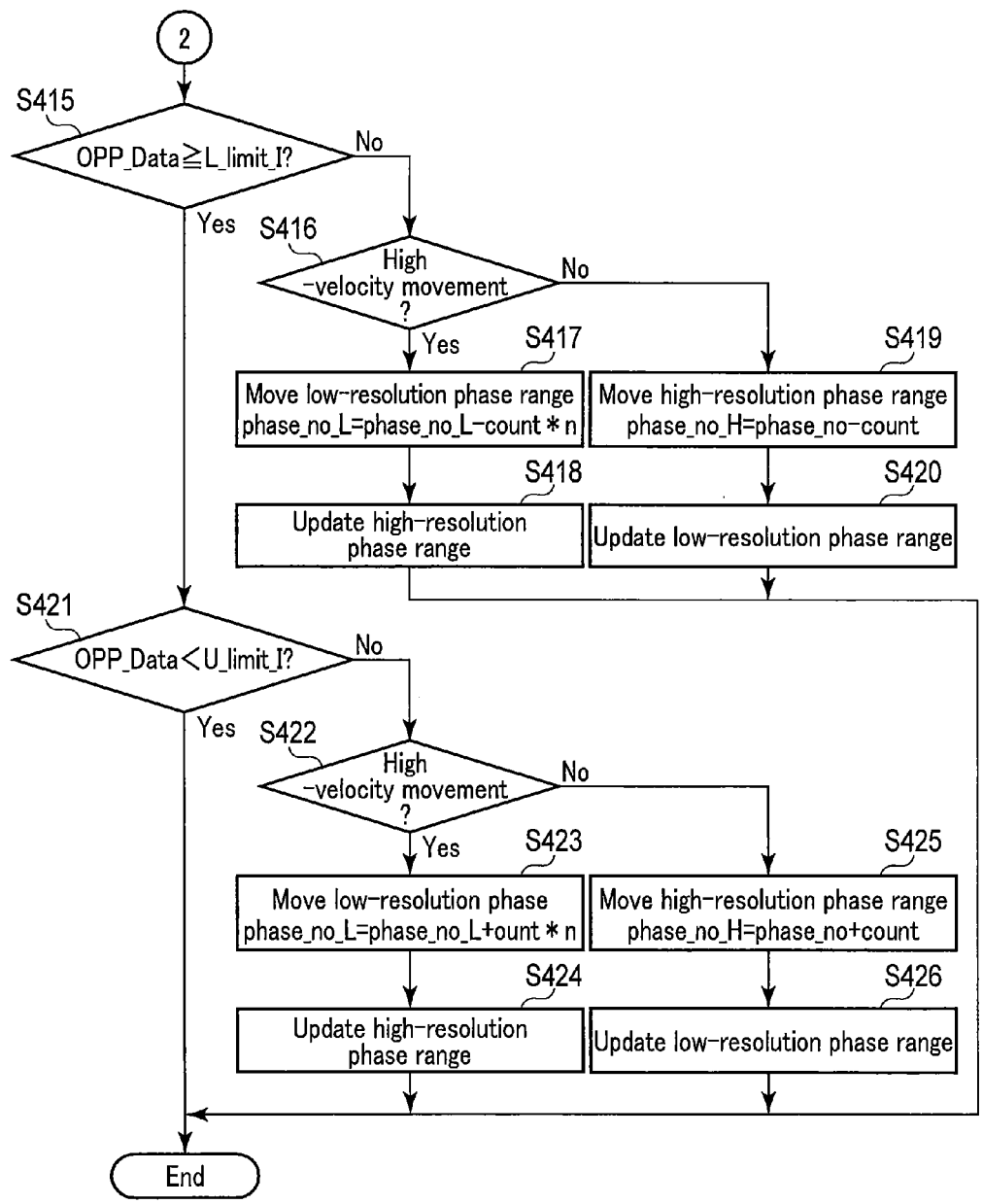
FIG. 22B is a flowchart illustrating the control of the interpolation unit in the interchangeable lens according to the fourth embodiment.

FIG. 22A and FIG. 22B are control flowcharts showing the flow of control by the interpolation unit 422 of the controller 42 according to the present embodiment. The technique according to the present embodiment can also be obtained by hardware.

First, the interpolation unit 422 converts A-phase and B-phase analog signals from the encoder 44 into digital signals (S41). The interpolation unit 422 then subtracts the standard value from each of the A-phase and B-phase signals converted into the digital signals, and converts each of the signals into a value with a sign (S42).

The interpolation unit 422 then estimates a corresponding region in 8-split one cycle from the relation between the A-phase signal and the B-phase (S43). This region can be estimated from the relation in FIG. 4, as in the second embodiment.

The interpolation unit 422 then determines whether the control state of the drive control unit 421 is the high-velocity drive (S44). The interpolation unit 422 sets an upper limit threshold and a lower limit threshold in accordance with the low-resolution table recorded in the threshold table recording unit 7 in the case of the high-velocity drive (S45). The interpolation unit 422 also sets an upper limit threshold and a lower limit threshold in accordance with the high-resolution table recorded in the threshold table recording unit 7 in the case of the low-velocity drive (S46).

The interpolation unit 422 then decides a rotation direction to change the phase range on the basis of the estimated region. To this end, the interpolation unit 422 determines whether the estimated region is the region I, VI, VII, or VIII (S47). When the estimated region is one of I, VI, VII, or VIII, the interpolation unit 422 sets the value of the count to 1 (S48). In contrast, when the estimated region is not one of I, VI, VII, and VIII, that is, when the estimated region is one of II, III, IV, and V, the interpolation unit 422 sets the value of the count to −1 (S49).

The interpolation unit 422 then determines the present region to decide the base and the opposite side (S410). When the present region is determined to be one of the regions I, IV, V, and VIII, the interpolation unit 422 sets so that the A-phase will be the base and the B-phase will be the opposite side. The interpolation unit 422 then respectively multiplies the A-phase signal AData by the upper limit threshold and the lower limit threshold to calculate a low-resolution upper limit value U_limit_1 and a low-resolution lower limit value L_limit_1 (S411). The interpolation unit 422 then selects the B-phase signal BData as OPP_Data (S412).

When the present phase range is determined not to be one of the regions I, IV, V, and VIII, that is, when the present phase region is one of the regions II, III, VI, and VII, the interpolation unit 422 sets so that the B-phase will be the base and the A-phase will be the opposite side. The interpolation unit 422 then multiplies the B-phase AD value by the upper limit threshold and the lower limit threshold to calculate a low-resolution upper limit value U_limit_1 and a low-resolution lower limit value L_limit_1 (S413). The interpolation unit 422 then selects the A-phase signal AData as OPP_Data (S414).

The interpolation unit 422 determines whether the value selected as the opposite side is equal to or more than the low-resolution lower limit value L_limit (S415). In the case of YES in this determination, the interpolation unit 422 shifts to the next determination, and determines whether the value selected as the opposite side is lower than the low-resolution upper limit value U_limit (S421).

In the case of NO in S415, the detected phase range is different from the previous one. Therefore, the interpolation unit 422 changes the phase range. In the present embodiment, the interpolation unit 422 determines whether the control state of the drive control unit 421 is the high-velocity drive (S416). When determining that the control state of the drive control unit 421 is the high-velocity drive, the interpolation unit 422 changes the low-resolution phase range (S417). This change is made by multiplying the count by n (=1/resolution). Here, if the same resolution as that in the third embodiment is used, the resolution is ½ and n=2. In this case, the phase range is changed as in the third embodiment. After the change of the low-resolution phase range, the interpolation unit 422 also brings the high-resolution phase range to the same phase range (S418).

In contrast, when determining that the control state of the drive control unit 421 is the high-velocity drive, that is, when the control state is the low-velocity drive, the interpolation unit 422 changes the high-resolution phase range. That is, the interpolation unit 422 subtracts the count from the present high-resolution phase range (S419). After the change of the high-resolution phase range, the interpolation unit 422 updates the low-resolution phase range to the low-resolution phase range including the high-resolution phase range after change (S420).

In the case of NO in S421 as well, the detected phase range is different from the previous one, so that the interpolation unit 422 changes the phase range. In the present embodiment, the interpolation unit 422 determines whether the control state of the drive control unit 421 is the high-velocity drive (S422).

When determining that the control state of the drive control unit 421 is the high-velocity drive, the interpolation unit 422 changes the low-resolution phase range (S423). The way of changing is basically similar to that in S417, but the difference is that the count is not subtracted but is added. The interpolation unit 422 then also brings the high-resolution phase range to the same phase range (S424).

In contrast, when determining that the control state of the drive control unit 421 is not the high-velocity drive, that is, when the control state of the drive control unit 421 is the low-velocity drive, the interpolation unit 422 changes the high-resolution phase range. That is, the interpolation unit 422 adds the count to the present high-resolution phase range (S425). Further, the interpolation unit 422 updates the low-resolution phase range to the low-resolution phase range including the high-resolution phase range after change (S426).

In the case of YES in both the judgments in S415 and S421, the previously estimated phase range and the currently estimated phase range correspond to each other, so that a phase range is estimated.

As described above, the interchangeable lens 40 according to the fourth embodiment of the present invention is capable of detecting a position with a resolution adjusted to the drive velocity, so that it is possible to reduce a calculation load for control and yet perform accurate position detection.

The control flow shown in each of the embodiments described above is one example to carry out the present invention and is not limited, and various modifications can be made without departing from the spirit of the present invention. The ratio between the low resolution and the high resolution is 1:2 in the third embodiment, but should be changed to the optimum value, for example, 1:10 in accordance with the movement velocity of the drive unit. It is also possible to have two or more resolutions instead of having only two resolutions. Moreover, if information regarding the velocity to drive the drive unit is available, the phase range has only to be detected once by optimizing the resolution in accordance with the drive velocity.

What is claimed is:

1. An interpolation apparatus for an encoder comprising:
an AD converter which converts a first sine wave signal generated in accordance with a change of a position of a measurement object into a digital signal to acquire a first input value, and converts a second sine wave signal which is generated in accordance with the change of the position of the measurement object and which is 90° different in phase from the first sine wave signal into a digital signal to acquire a second input value; and
a processor comprising hardware, the processor configured to:
output one of the first input value and the second input value as a reference value and the other as a comparison value;
record a threshold table to associate upper limit thresholds as first boundary angles and lower limit thresholds as second boundary angles with tangent values;
multiply a first tangent value by the reference value, to calculate a first threshold, the first tangent value being based on a first boundary angle decided from the processor on the basis of a phase range of the reference value;
multiply a second tangent value by the reference value to calculate a second threshold, the second tangent value being based on a second boundary angle decided from the processor on the basis of the phase range of the reference value;
determine that the comparison value is higher or lower than the first threshold, wherein the comparison value is within a particular phase range specified by the first threshold and the second threshold, the comparison unit and that the comparison value is higher or lower than the second threshold when the comparison unit determines that the comparison value is not within the particular phase range; and
update the particular phase range to a phase range adjacent to a direction corresponding to the result of determination by the comparison unit as to whether the comparison value is higher or lower than the first threshold and the second threshold when the comparison unit determines that the comparison value is not within the particular phase range.

2. The interpolation apparatus for the encoder according to claim 1, wherein an operation from the acquisition of the first input value and the second input value by the AD converter to the update of the particular phase range by the processor is repeated at a constant cycle.

3. The interpolation apparatus for the encoder according to claim 2, wherein the constant cycle is shorter than a period of one phase range.

4. The interpolation apparatus for the encoder according to claim 1, wherein the processor is further configured to:
determine a region corresponding to the first input value and the second input value among regions of one cycle of the first sine wave signal and the second sine wave signal split into octants by 45° on the basis of signs of the first input value and the second input value and magnitude relation of absolute values of the first input value and the second input value,
wherein the processor sets the phase range by splitting the determined region to make the determination.

5. The interpolation apparatus for the encoder according to claim 4, wherein the number of splits of the region is smaller when the change of the phase relation between the first sine wave signal and the second sine wave signal is greater.

6. The interpolation apparatus for the encoder according to claim 4, wherein the number of splits of the region is smaller when velocity of the measurement object is lower.

7. The interpolation apparatus for the encoder according to claim 5, wherein the processor is further configured to:
record a threshold table to associate the first boundary angles with the first tangent values and associate the second boundary angles with the second tangent values,
wherein the number of splits of the region is changed by changing a reference method of the threshold table.

8. The interpolation apparatus for the encoder according to claim 5, wherein the processor is further configured to:
record threshold tables that are different in association of the first boundary angles with the first tangent values and the association of the second boundary angles with the second tangent values,
wherein the number of splits of the region is changed by selecting one of the threshold tables.

9. A driver comprising:
a drive unit which drives the measurement object;
an encoder which generates the first sine wave signal and the second sine wave signal in accordance with the change of the position of the measurement object; and
the interpolation apparatus for the encoder according to claim 1.

10. A controlling method of an interpolation apparatus for an encoder, the controlling method comprising a processor comprising hardware, the processor configured to:
convert a first sine wave signal generated in accordance with the change of a position of a measurement object into a digital signal to acquire a first input value, and converting a second sine wave signal which is generated in accordance with the change of the position of the measurement object and which is 90° different in phase from the first sine wave signal into a digital signal to acquire a second input value;
output one of the first input value and the second input value as a reference value and the other as a comparison value;
record a threshold table to associate upper limit thresholds as first boundary angles and lower limit thresholds as second boundary angles with tangent values;
use one of the first input value and the second input value as a reference value and using the other as a comparison value to multiply a first tangent value by the reference value to calculate a first threshold, the first tangent value being based on a first boundary angle decided by the processor on the basis of a phase range of the reference value;
multiply a second tangent value by the reference value to calculate a second threshold, the second tangent value being based on a second boundary angle decided by the processor on the basis of the phase range of the reference value;
determine whether the comparison value is within a particular phase range specified by the first threshold and the second threshold, and determining that the comparison value is higher or lower than the first threshold and that the comparison value is higher or lower than the second threshold when the processor determines that the comparison value is not within the particular phase range; and
update the particular phase range to a phase range adjacent to a direction corresponding to the result of determination as to whether the comparison value is higher or lower than the first threshold and the second threshold when the comparison value is determined not to be within the particular phase range.

11. A non-transitory storage medium storing a controlling program of an interpolation apparatus for an encoder, the controlling program causing a computer to:
convert a first sine wave signal generated in accordance with the change of a position of a measurement object into a digital signal to acquire a first input value, and convert a second sine wave signal which is generated in accordance with the change of the position of the measurement object and which is 90° different in phase from the first sine wave signal into a digital signal to acquire a second input value;
output one of the first input value and the second input value as a reference value and the other as a comparison value;
record a threshold table to associate upper limit thresholds as first boundary angles and lower limit thresholds as second boundary angles with tangent values;
use one of the first input value and the second input value as a reference value and use the other as a comparison value to multiply a first tangent value by the reference value to calculate a first threshold, the first tangent value being based on a first boundary angle decided by the computer on the basis of a phase range of the reference value;
multiply a second tangent value by the reference value to calculate a second threshold, the second tangent value being based on a second boundary angle decided by the computer on the basis of the phase range of the reference value;
determine whether the comparison value is within a particular phase range specified by the first threshold and the second threshold, and determine that the comparison value is higher or lower than the first threshold and that the comparison value is higher or lower than the second threshold when the computer determines that the comparison value is not within the particular phase range; and
update the particular phase range to a phase range adjacent to a direction corresponding to the result of a judgment as to whether the comparison value is higher or lower than the first threshold and the second threshold when the comparison value is determined not to be within the particular phase range.

* * * * *